United States Patent

Loveall et al.

[11] Patent Number: 6,119,305
[45] Date of Patent: *Sep. 19, 2000

[54] SEALING ELEMENTS

[75] Inventors: Kevin D. Loveall, Pasadena; Hari Pallapothu, Fontana; Raymond Hansen, Simi Valley; Hemant Gupta, Sylmar, all of Calif.

[73] Assignee: TA Mfg Co., Valencia, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,077

[22] Filed: Dec. 19, 1997

Related U.S. Application Data

[63] Continuation-in-part of application No. 08/877,437, Jun. 17, 1997, abandoned.

[51] Int. Cl.[7] ................................ F16L 5/02; H01B 17/26
[52] U.S. Cl. ..................... 16/2.2; 174/65 G; 174/152 G; 174/153 G; 174/35 R; 174/35 C
[58] Field of Search ..................... 16/2.1, 2.2; 174/65 G, 174/152 G, 152 R, 153 G, 152 E, 35 R, 35 C, 35 GC

[56] References Cited

U.S. PATENT DOCUMENTS

| | | |
|---|---|---|
| 2,234,441 | 3/1941 | Ludwig . |
| 2,922,836 | 1/1960 | Brown ................................ 174/153 G |
| 3,182,119 | 5/1965 | Millard . |
| 3,182,120 | 5/1965 | Duhn . |
| 3,243,240 | 3/1966 | Arthur ................................ 174/153 G |
| 3,654,382 | 4/1972 | Rubright . |
| 3,916,360 | 10/1975 | Pedersen et al. . |
| 4,674,807 | 6/1987 | Boteler et al. . |
| 4,959,509 | 9/1990 | Takeuchi et al. ................... 174/153 G |
| 5,836,048 | 11/1998 | Rossman et al. ........................ 16/2.2 |

OTHER PUBLICATIONS

UK Patent Application, 2,269,945 A, Feb. 1994.

*Primary Examiner*—Chuck Y. Mah
*Assistant Examiner*—Donald M. Gurley
*Attorney, Agent, or Firm*—Henricks, Slavin & Holmes LLP

[57] ABSTRACT

Electrically conductive sealing elements include a resilient grommet portion and an electrically conductive portion imbedded in a portion of the grommet so as to provide EMI protection and/or an electrically conductive path from a workpiece to a panel into which the grommet can be inserted.

44 Claims, 12 Drawing Sheets

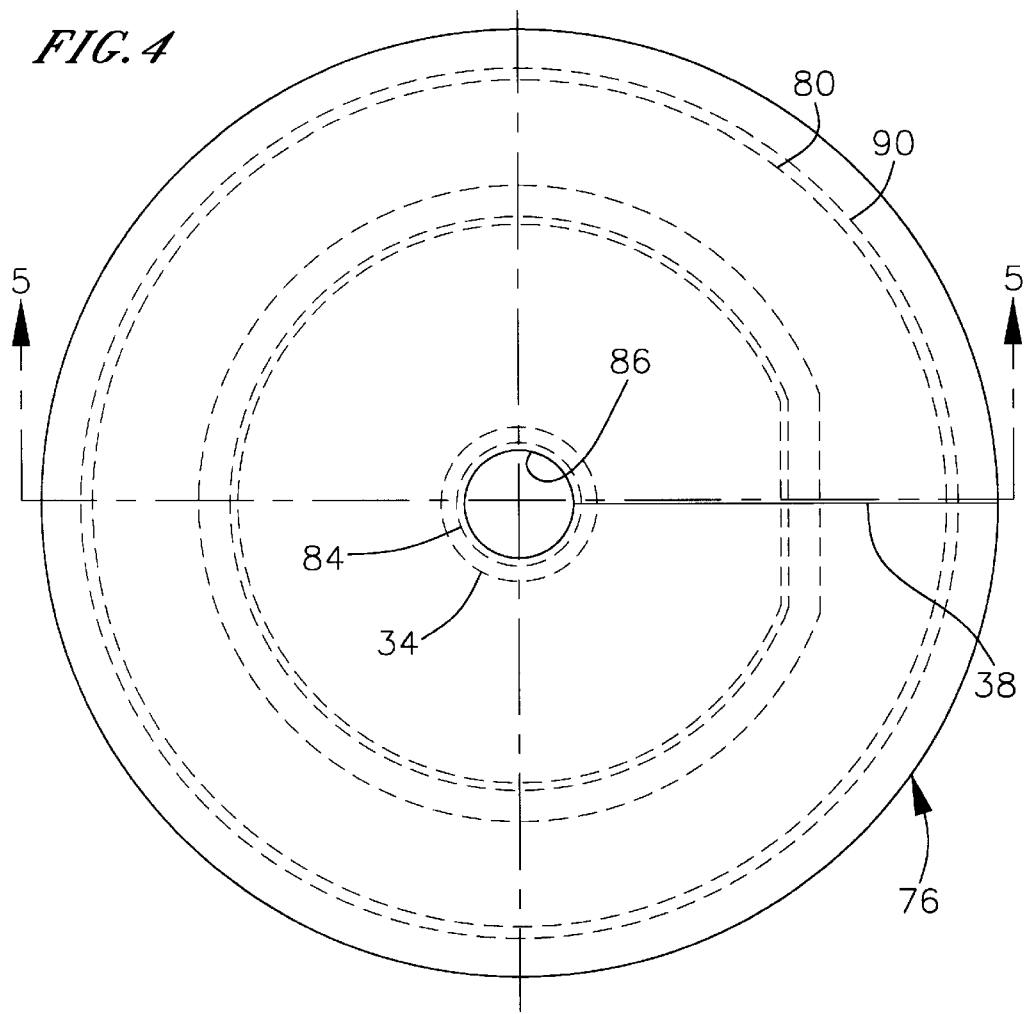
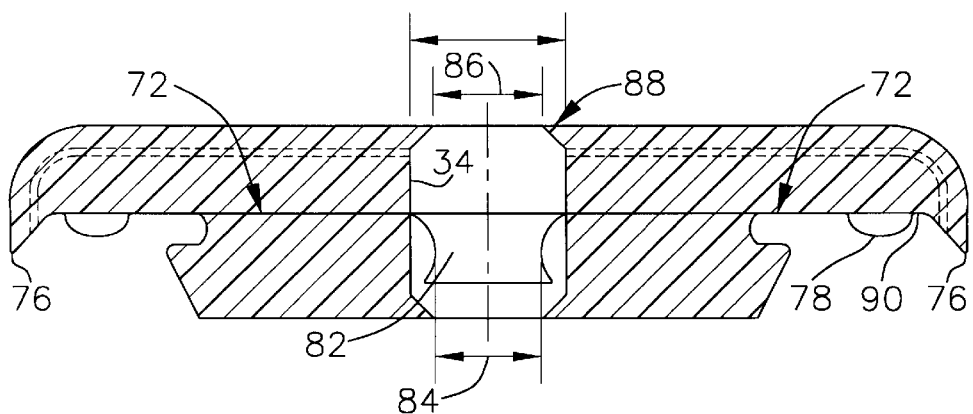

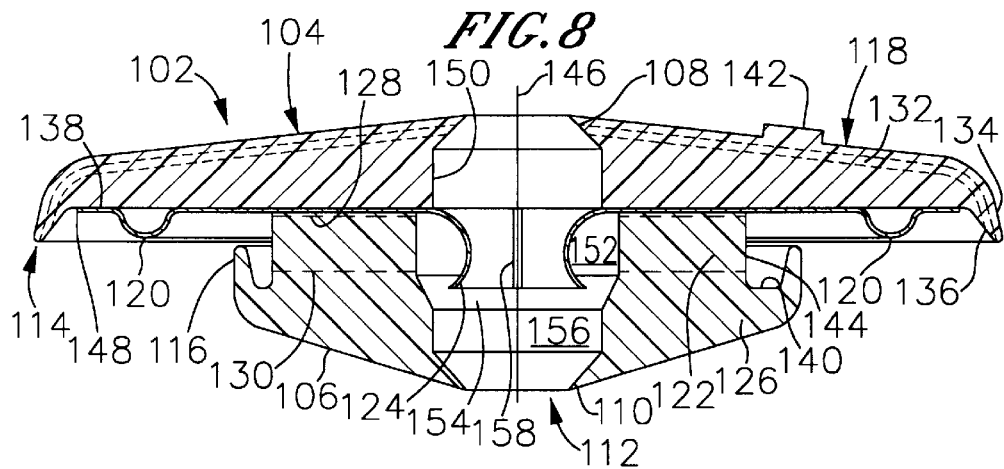
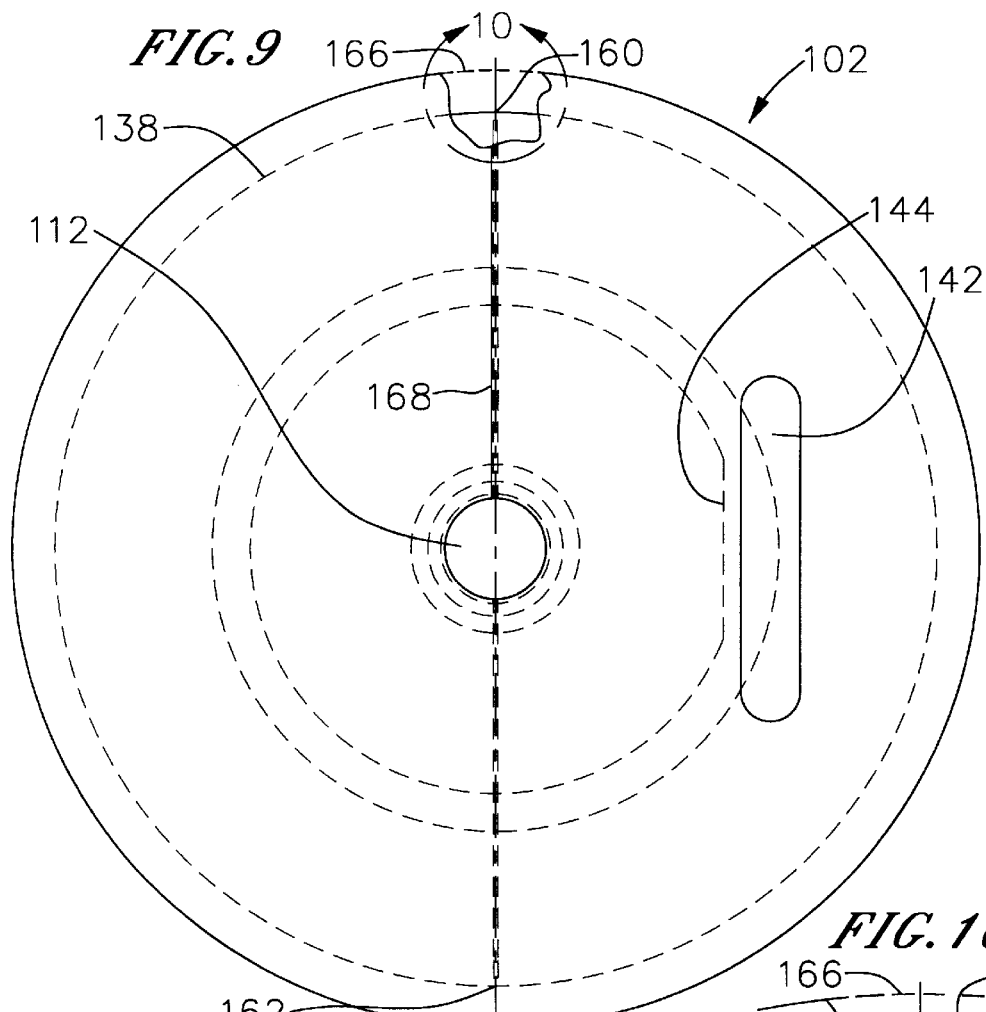
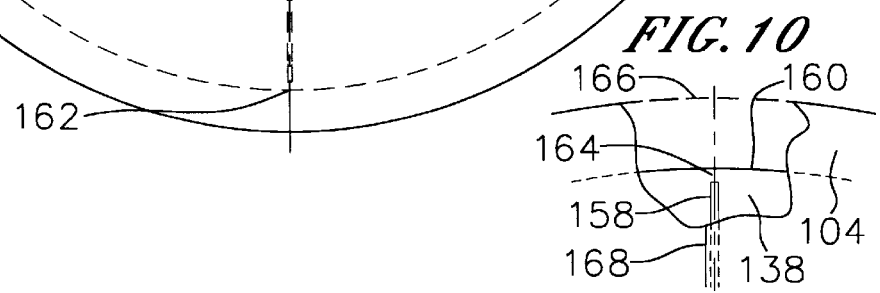

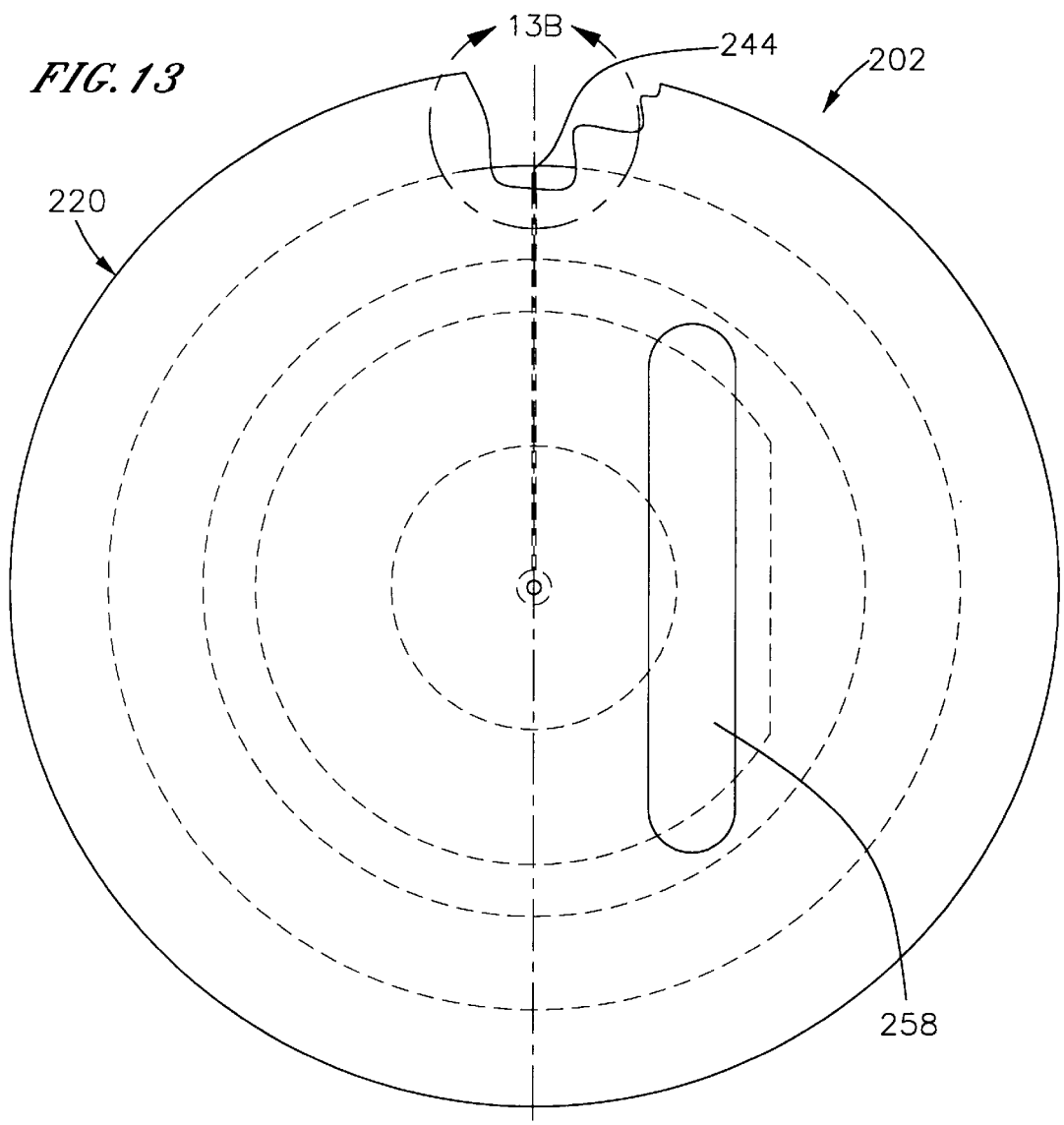
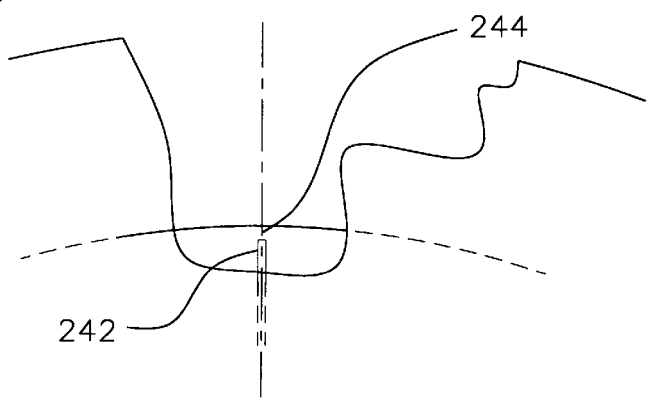

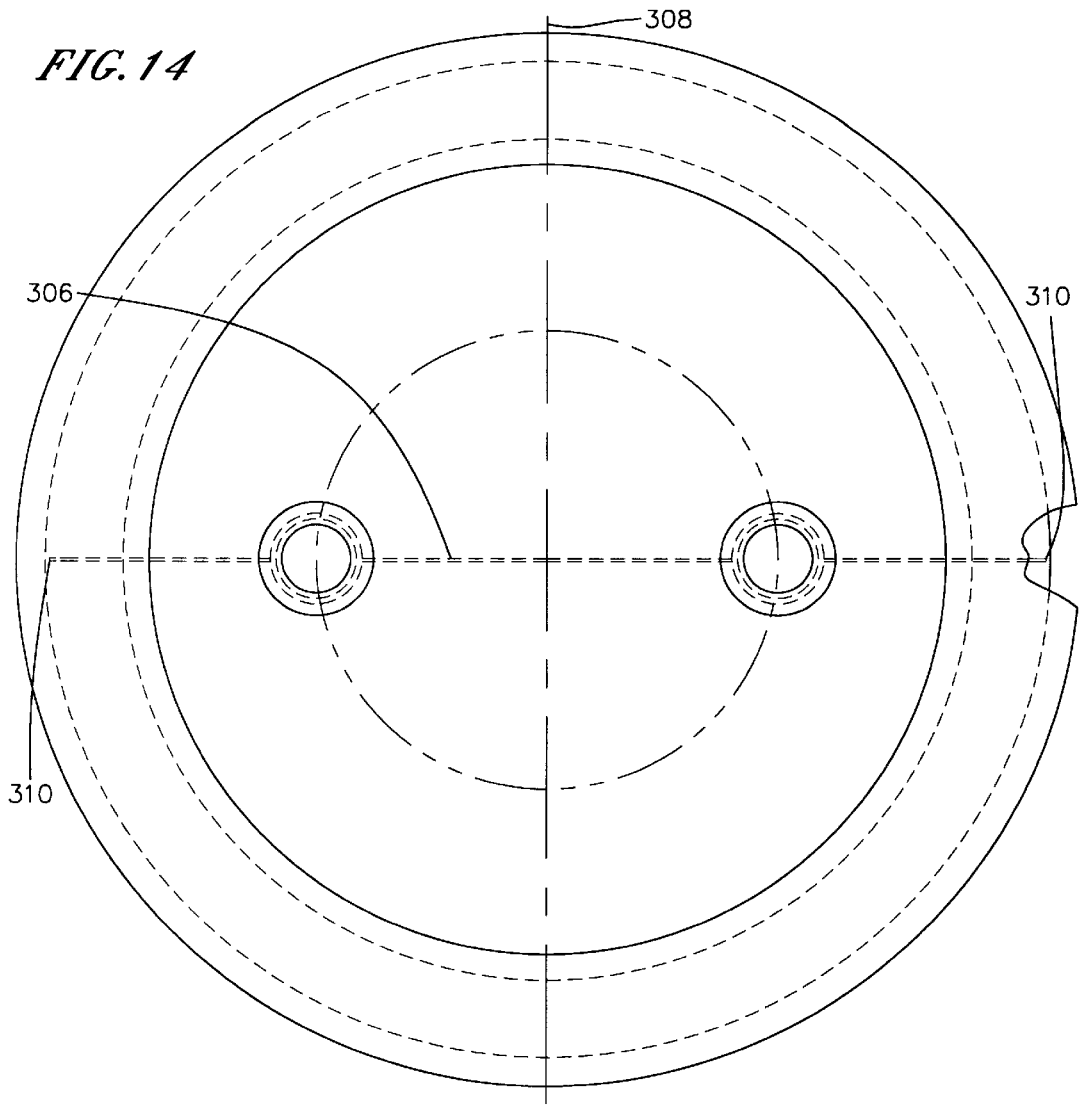
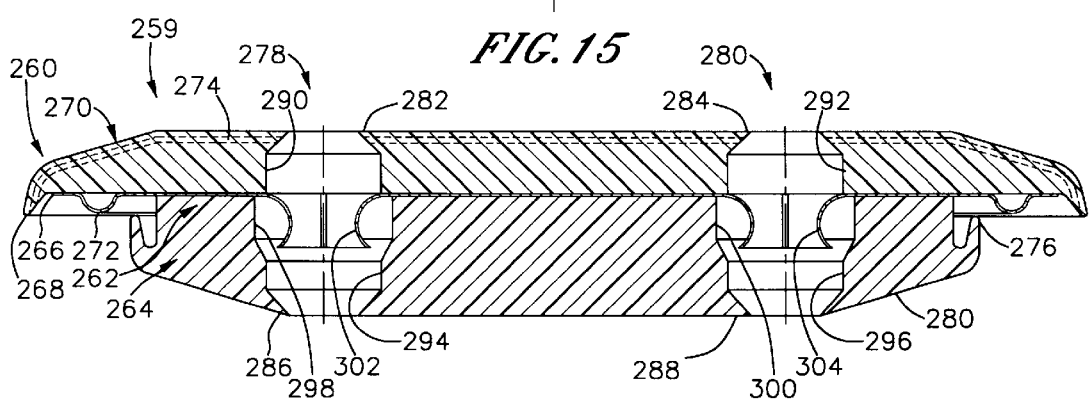

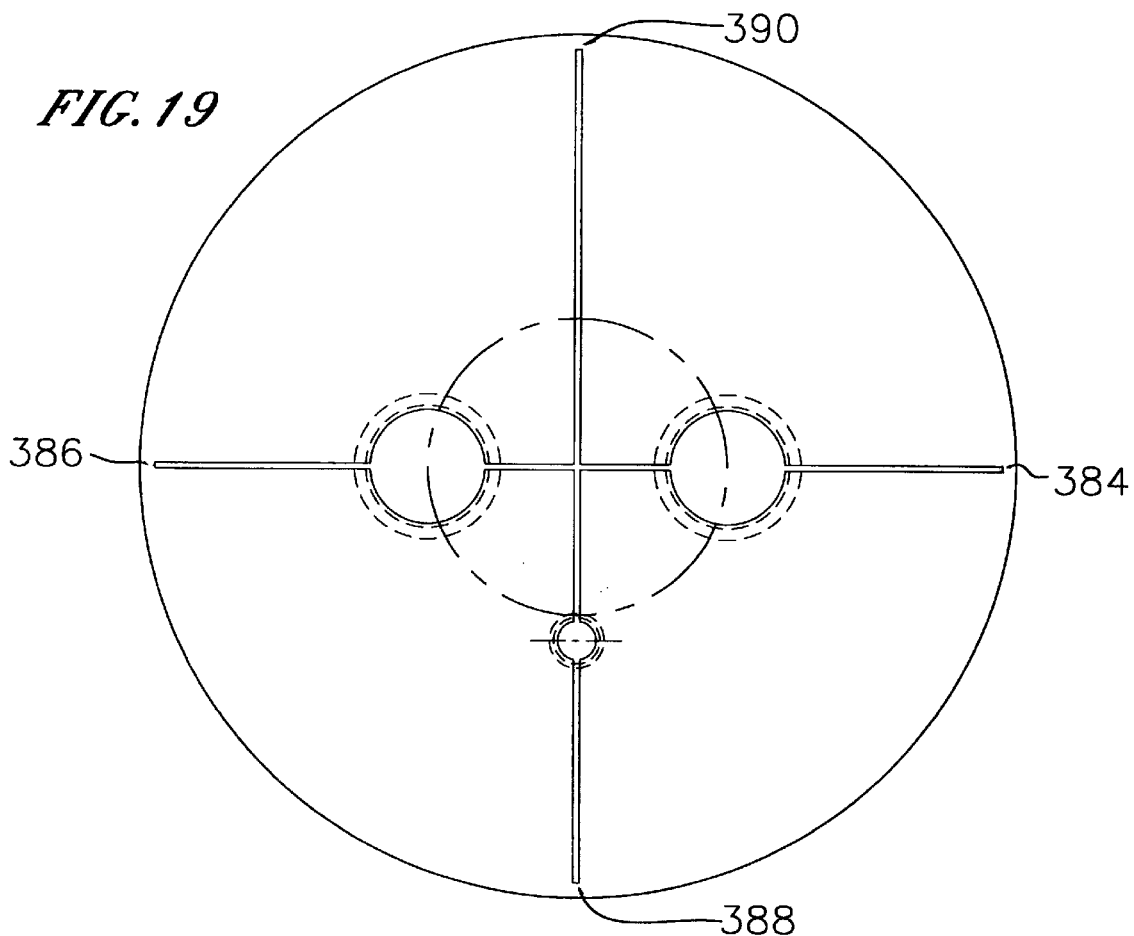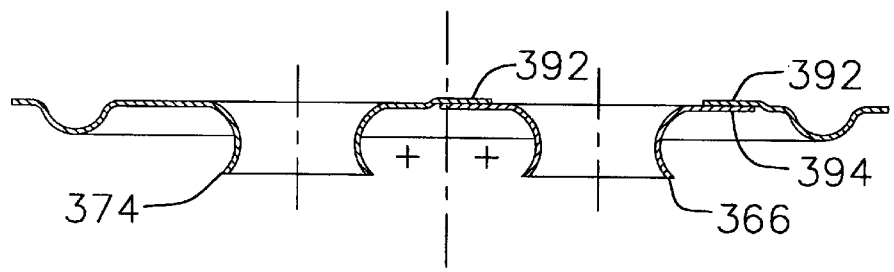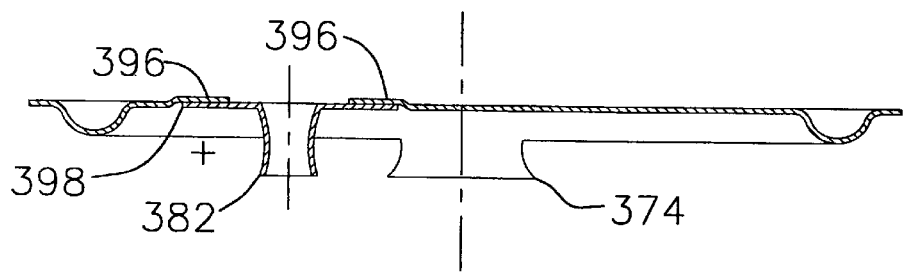

SEALING ELEMENTS

CROSS REFERENCE TO RELATED APPLICATIONS

This application is a Continuation-In-Part of Ser. No. 08/877,437, filed Jun. 17, 1997, abandoned.

BACKGROUND OF THE INVENTION

1. Field of the Invention

This invention relates to sealing elements such as grommets for use in isolating structural members, such as for use in aircraft electrical systems or tubing feed-throughs, such as those where tubing or electrical cables penetrate the web of a structural member or containment wall. In one specific application, the invention relates to a grommet which maintains electrical continuity between a tube or cable and a structure through which the tube or cable passes, such as a metal panel, bulkhead or the like.

2. Related Art

Single piece elastomer grommets are commonly used for cable and tubing penetrations in aircraft and other industries. However, the use of single piece elastomer grommets is typically limited to standard specification applications other than those requiring electrical conductivity.

Electrical continuity is important in aircraft safety in order to protect aircraft systems from damage caused by electrical faults, lightning strikes and other forms of electromagnetic interference (EMI). Fire and pressure containment is also important to protect personnel and equipment and to minimize the effect on the overall aircraft by fire in one location or pressure differentials between two locations. Single piece elastomer grommets have served the function of pressure and fire containment but do not protect against EMI.

Current methods of maintaining electrical continuity, pressure sealing and fire containment use a metal bulkhead fitting consisting of threaded metal pieces and a rubber insert. These fittings can often be quite complex, consisting of between 3 and 18 or more pieces. These fittings are relatively heavy, have a relatively high cost and require a relatively lengthy time for installation. Often, these fittings require use of a sealant to protect the joint against galvanic corrosion and other environmental effects. These fittings also require substantial testing to ensure proper sealing and electrical continuity. If repair or replacement is required, the fitting must be removed, the surrounding area cleaned and a new fitting and seal installed, again requiring a substantial amount of time and effort.

In conventional fittings, the fitting can accommodate only a single cable, or cable bundle where more than one cable is bundled into a single assembly. As a result, multiple cables may be combined into a bundle for purposes of passing through the fitting, even though their function or final location in an aircraft, for example, may be unrelated. Multiple cables are often bundled basically because of limitations in fitting arrangements, as opposed to because of the locations where the cables will end up or the cable functions.

SUMMARY OF THE INVENTION

The present invention provides an interface or seal element or grommet which provides electrical continuity, electromagnetic interference (EMI) protection and can also provide pressure and fire containment without the cumbersome and complicated structures and procedures required by conventional methods and apparatus. The grommet of the present invention provides a relatively low cost, lightweight and easy to install grommet which does not require special tools or implements for installation. Multiple steps are not required in the assembly or installation or service of the grommet as are required in conventional devices. Separate pieces are not required to serve each of the fire containment function, the pressure containment function, the EMI protection function and the electrical continuity function. The device of the present invention preferably accomplishes these functions in a single piece.

In accordance with one preferred aspect of the present inventions, a sealing element is provided for sealing an opening in a panel. The sealing element includes a portion extending over part of a panel, including an outer surface and an inner surface for contacting a portion of a panel. An exposed conductive surface suitable for blocking electromagnetic radiation is positioned adjacent the inner surface for contacting a portion of a panel. The sealing element further includes a holding portion for holding the sealing element within an opening in a panel and for holding the inner surface against a panel. Preferably, the portion for extending over a panel is a circular flanged portion wherein the outer surface is sloped or slanted at an angle relative to the panel surface. Also preferably, the conductive surface is continuous for almost substantially the entire circumference of the conductive surface. Where the sealing element is a plug or other closed element, the plug preferably includes a pocket or recess in the base thereof to make it easier to insert into a panel opening. The base of the plug may also include a wall extending from the base of the plug and directed toward the flanged portion in order to better engage the panel and hold the plug in place.

In accordance with a further preferred aspect of the present invention, an electrically conductive sealing element includes a resilient grommet portion and a metallic or electrically conductive or dissipative portion positioned, supported by or imbedded in a portion of the grommet so as to provide an electrically conductive path from a workpiece to a panel into which the grommet is inserted. In a preferred embodiment, the metallic conductive portion is imbedded in the grommet portion in such a way that the metal is sandwiched between an outer grommet portion and an inner grommet portion. In the preferred embodiment, the metal includes an annular portion extending around and contacting the workpiece and a planer portion electrically coupled to the annular portion for contacting the panel, thereby maintaining electrical conductivity between the workpiece and the panel. Also, in a preferred embodiment, the electrically dissipative or conductive portion is relatively continuous across its surface so as to provide EMI protection for the grommet and across the opening in the panel.

In a further preferred form of the invention, an electrically conductive sealing element for sealing a pass-through element in a panel includes a flange portion and an exposed conductive or metallic surface for contacting a portion of the panel, a feed-through portion for extending through an opening in the panel and having an exposed conductive or metallic surface for contacting a portion of the pass-through element and also in electrical contact with the exposed conductive or metal surface, and a holding portion for holding the sealing element within an opening in the panel.

In a further preferred form of the invention, the metallic conductive portion includes a cylindrical portion, preferably circular in cross-section, for contacting the workpiece to provide a substantially 360° conductive path between the workpiece and the panel or other structures through which the workpiece passes. The cylindrical conductor is formed integral with an extended flared planar conductor which extends radially outwardly through the resilient portion of the grommet to an exposed area for contacting the panel, bulkhead or other structures through which the workpiece passes. The cylindrical and planar conductive portion provides the substantially 360° path between the workpiece and the structure through which it passes.

In a further alternative embodiment, the outermost portion of the flared planar portion may include discontinuities such as bulges or projections for contacting the panel and enhancing the conductive contact between the metal and the panel. The projections or protrusions can extend around substantially the entire circumference of the planar portion of the conductor or may be interspersed around the circumference. While one preferred embodiment has the cylindrical metal portion being right circular cylindrical, it can also be formed so as to curve inwardly as in a section of a toroid to enhance the metallic contact with the workpiece.

In other embodiments of the present invention, the preferred configurations of the resilient grommet portion and the electrically conductive portions about the workpieces may be used in multiple openings for a single grommet. For example, a single grommet may accommodate two workpieces of the same or different diameters. The grommet could then provide, for each workpiece passing through it, EMI protection, electrical conductivity, pressure and fire protection.

The grommets can be made to have any number of thicknesses so that the design can accommodate different panel thicknesses, and any number of diameters to accommodate a number of different panel-opening inside diameters. The grommets can have a number of overall outside diameters for extending over portions of the panels, and may have a number of different configurations for contacting and sealing against the panel surfaces. Furthermore, the grommet can include locating keys or indicators to assist in properly positioning the grommet about the workpiece and in the panel opening.

The designs of the present invention can be also incorporated in one or more ways into a plug, filler or seal for completely covering and closing an opening in a panel. Such a plug can provide one or more of the intended functions of the grommets, including fire protection, pressure protection, EMI protection and/or electrical conductivity. Use of such a plug minimizes or eliminates the need for rivets, sealants and the like to close an opening in a panel. Such a plug also permits later access to the opening for installing cables or other workpieces if necessary.

Grommets in accordance with one aspect of the present inventions preferably include sloped or slanted surfaces on either or both of the top and bottom exposed surfaces of the grommet. Sloped surfaces permit use of additional material for integrity of the grommet, provide additional bias or support for fully engaging the workpiece passed through the opening, and forming an adequate seal around the workpiece. The additional material may also help to maintain engagement of the grommet with the panel and ensure an acceptable seal between them.

Grommets according to an additional aspect of the present inventions, may also include a wall spaced from the body of the grommet and facing the panel to assist in holding the grommet in place, forming an appropriate seal on the respective site of the grommet and/or making it easier to insert and properly position the grommet in the panel.

The grommet of the present invention preferably provides cost, weight and installation time savings over conventional metal fittings or irises because of the substantially reduced piece part design, preferably in the form of a single piece, having an elastomeric construction which is cut or slit to readily fit over cables and tubes upon insertion into an aperture in a structural member, panel or wall. The grommet provides electrical continuity by a relatively thin electrical contact extending throughout much of the grommet. The grommet design and material also provides in the preferred embodiment EMI protection and air pressure and fire containment without use of sealants, potting or adhesives. The preferred design also provides corrosion resistance by sealing against moisture and other fluids.

The preferred grommet is also easier to replace and maintain relative to conventional fittings. It can be easily and quickly removed and replaced without use of special tools or special chemicals. Therefore, the grommet improves the serviceability of electrical and tubing systems by reducing the time and effort required to maintain the integrity of a penetration in a metal or other structure. With the preferred grommet, the conductive path from any point on the surface of the workpiece to any point on the surrounding structure may have a maximum electrical resistance of as low as 2.5 milliohms, and can contain air pressure differentials of between 2 to 20 PSI.

These and other aspects of the present invention will be more clearly understood by considering the drawings and detailed descriptions set forth below.

BRIEF DESCRIPTION OF THE DRAWINGS

FIG. 4 is a top plan view of a further embodiment of a conductive grommet according to the present invention.

FIG. 5 is a cross-section of the grommet of FIG. 4 taken along lines 5—5 of FIG. 4.

FIG. 8 is a cross-section of the grommet according to a further aspect of the present inventions incorporating a slope outer and/or inner surface.

FIG. 9 is a top plan view of view of the grommet of FIG. 8.

FIG. 10 is a detail, partial cut-away of a portion of the grommet of FIG. 8 taken at the location shown in FIG. 9.

FIG. 13 is a top plan view of a grommet according to a further aspect of the present inventions.

FIG. 13B is a detail and a partial cutaway view of a part of the rim of the grommet of FIG. 13.

FIG. 14 is a top plan view of still another grommet according to further aspects of the present inventions.

FIG. 15 is a cross-sectional view of the grommet of FIG. 14.

FIG. 19 is a top plan view of a metal insert for use with the grommet of FIGS. 16–18.

FIG. 20 is a cross-sectional view of the metal insert of FIG. 19.

FIG. 21 is a further cross-sectional view of the metal insert of FIG. 19 rotated ninety degrees from that of FIG. 20.

DETAILED DESCRIPTION OF THE PREFERRED EMBODIMENTS

A conductive sealing element or grommet is described which provides electrical continuity and/or EMI protection and it may also provide pressure and fire containment in a form which has lower cost, is easier to manufacture, assemble and install, and which is easier to replace and maintain over conventional fixtures. The element is lighter in weight, and has fewer piece parts than conventional fixtures.

Figure 1:
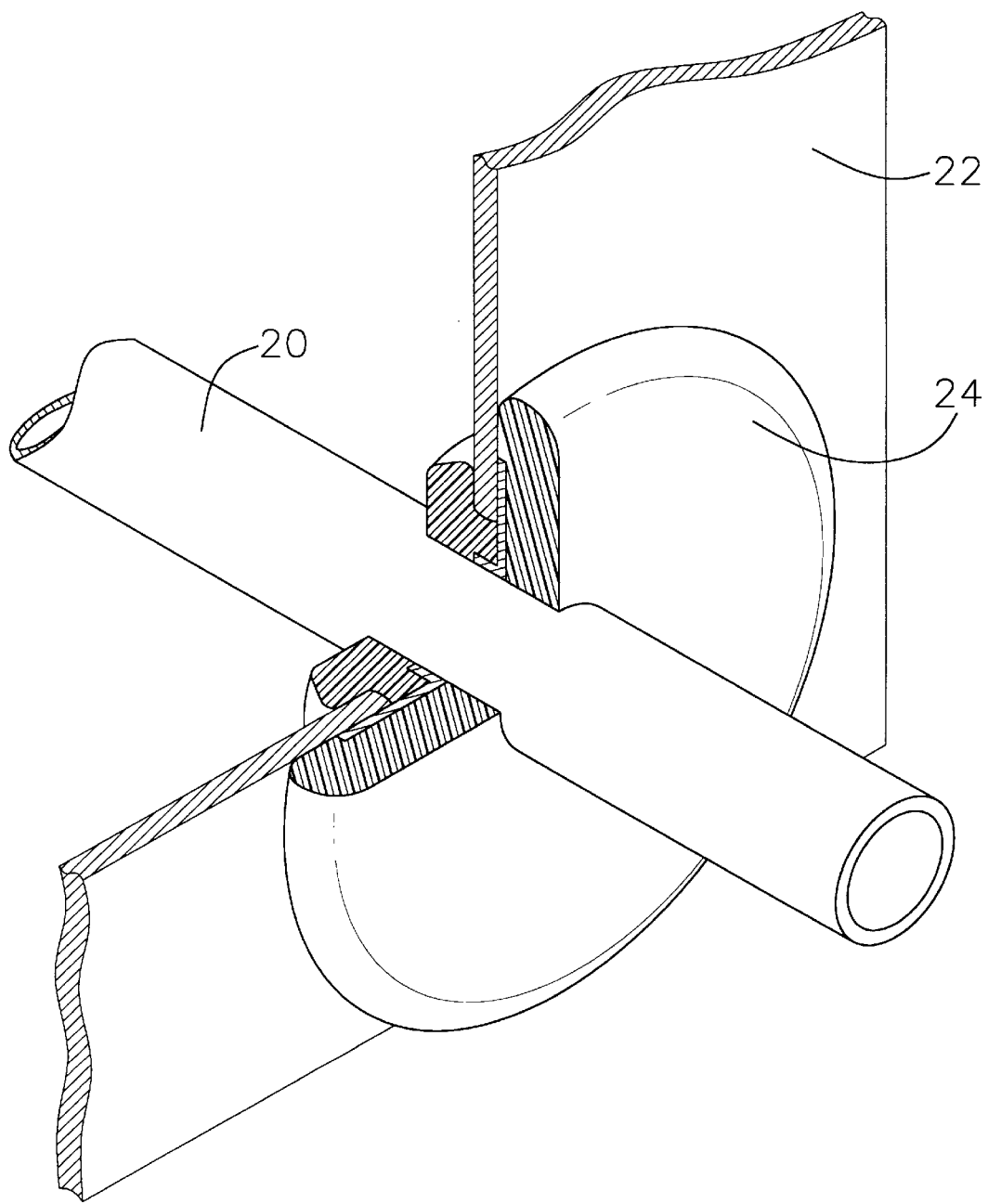
FIG. 1 is a schematic of a grommet, workpiece and structure or panel showing one application of the grommet of the present invention.

In the environment of aircraft and other structures requiring electrical system or tubing feed-throughs, such as those where tubing or electrical cables 20 (FIG. 1) penetrate the web such as a barrier wall, panel or bulkhead 22, a sealing element 24 seals between the panel 22 and the pass-through element or workpiece 20. The sealing element is electrically conductive so as to provide an electrically conductive path between the workpiece 20 and the panel 22. The sealing element may conventionally be termed a grommet, and may also have other functions such as fire resistance and pressure containment. In the preferred embodiment, the grommet, described more fully below, provides all three functions, namely electrical continuity, and pressure and fire containment between the workpiece 20 and the panel 22.

The workpiece 20 may take any number of forms. For example, the workpiece could be hydraulic tubing, electrical cable, or wire rope or cable. Generally, the workpiece 20 and the panel 22 are conventional structures found in aircraft and comparable applications. The panel may be any suitable structure through which the workpiece will be passed.

Figure 3:
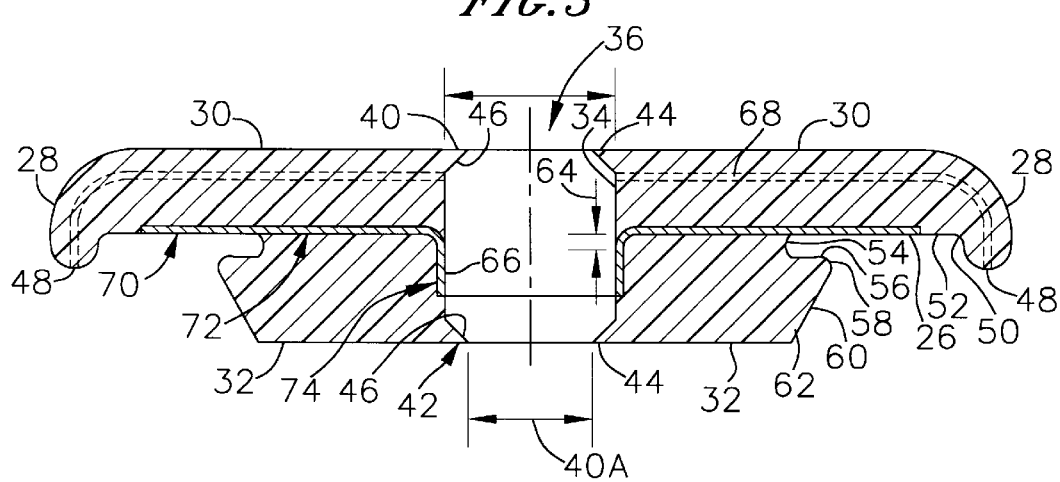
FIG. 3 is a cross-sectional view of a conductive grommet as shown in FIG. 2 taken along lines 3—3 of the FIG. 2.

Considering the grommet in more detail, one embodiment of the grommet includes an electrically conductive material represented at 26 in FIG. 3. The electrically conductive material may take any number of forms and configurations, but preferably ensure electrical contact with the workpiece and with the panel. The grommet includes an outer rim 28 defining the outermost circumference of the grommet. While the grommet described herein will be considered in the context of a circular grommet, it should be understood that other shapes are possible for the outer profile of the grommet as well as the cross-sectional configuration of the opening which accepts the workpiece. The grommet includes an outer or first surface 30 defined by the outer rim 28 and an inner or second surface 32 opposite the outer surface 30. The outer and inner surfaces 30 and 32, respectively, are positioned on opposite sides of the panel when the grommet is installed. The outer and inner surfaces are preferably substantially planar in the embodiment of FIG. 3, except for the transitions; from the planar surfaces to other surfaces, described more fully below. It should be noted that the terms "outer" and "inner" are used for convenience and reference but are not intended to be limitations on the use or orientation of the sealing element.

The grommet includes a first substantially cylindrical wall 34 for enclosing and preferably sealing with the workpiece. The cylindrical wall 34 extends entirely through the grommet from the outer surface to the inner surface, defining a central bore 36 through which the workpiece passes. The grommet includes a cut or slit preferably extending in a straight line along a radius from the outer rim 28 to the cylindrical wall 34, without any appreciable gap between the disconnected portions of the grommet to allow the grommet to be assembled around the intended workpiece and so that the cylindrical wall 34 can seal around the workpiece. The slit is shown at 38 in FIG. 2. Strictly speaking, because the slit 38 corresponds with part of the line 3—3 in FIG. 2, the right half of FIG. 3 is generally not sectioned. However, because the slit is preferably formed by cutting the final assembled grommet, the section lines are shown in FIG. 3. It should be understood that the slit 38 can be formed in other configurations, such as off the radius, as a crooked or wavy line, or other configurations, while preferably maintaining good sealing characteristics once fully assembled on the panel and also preferably maintaining ease of assembly. The slit 38 is preferably between 0.060 inch and 0.010 inch width in metal insert and line to line in the rubber, with 0.012 inch being preferred for adequate EMI protection. Additionally, the metal can be cut so as to minimize any loss of material so that little or no gap exists between the two metal pieces when the cut surfaces are rejoined or repositioned opposite each other.

The cylindrical wall 34 preferably includes an outer circumferential projection 40 and an inner circumferential projection 42 for ensuring the desired seal between the grommet and the workpiece. In the preferred embodiment, both the outer projection 40 and the inner projection 42 extend completely around the bore 36. The outer projection may be formed integral with the rest of the grommet body or separately molded to or adhered to the body, as can the inner projection 42. Preferably, the projections 40 and 42 include flat outer surfaces 44 and angled interior surfaces 46. In the preferred embodiment, the remainder of the cylindrical wall 34 is substantially right circular cylindrical.

The rim 28 extends downwardly, as viewed in FIG. 3 to a rounded or other shaped tip 48 which curves inwardly to a junction 50 between the tip 48 and a first lip or first panel engagement wall 52. The first panel engagement wall 52 extends radially inwardly from the tip 48 to a panel rim contact wall 54 for engaging the exposed wall defining the opening through the panel 22. As shown in FIG. 3, part of the first panel engagement wall 52 is formed by part of the conductive portion 26 in the grommet.

The projections 40 and 42 and the tip or surface 48 preferably engage their intended surfaces in such a way as to provide good pressure containment and a seal against a pressure differential and any fluids such as hydraulic fluid or air. The projections and surfaces can take any number of configurations but preferably form extensions on the grommet surfaces to engage the work-piece or the panel, as the case may be, so that the projections or surfaces deform or compress, thereby increasing the pressure between the surface and the work-piece or panel, as the case may be. The material selected, as well as the configuration of the surfaces selected, preferably enhance and optimize the seal created once the grommet and work-piece are assembled with the grommet in the panel opening. The configurations shown in the preferred embodiments are believed to provide suitable barriers to the environment such as moisture, grit and other foreign matter which may corrode or wear any interface between the electrically conductive junctions between the workpiece and the metal insert and between the metal insert and the panel. These barriers protect these junctions not only from immediate deterioration due to fluids or other harmful materials but also from gradual deterioration such as from grit or other wearing materials which may work into the junction.

The panel rim contact wall 54 extends from the first panel engagement wall 52 to the second lip or second panel engagement wall 56 which cooperates with the first panel engagement wall 52 to sandwich the panel between those two walls. Sandwiching of the panel between the first and second panel engagement walls helps to maintain the desired seal between the grommet and the panel. Engagement of the conductive portion 26 with the surface of the panel helps to ensure electrical conductivity between the conductive portion 26 and the panel.

Figure 2:
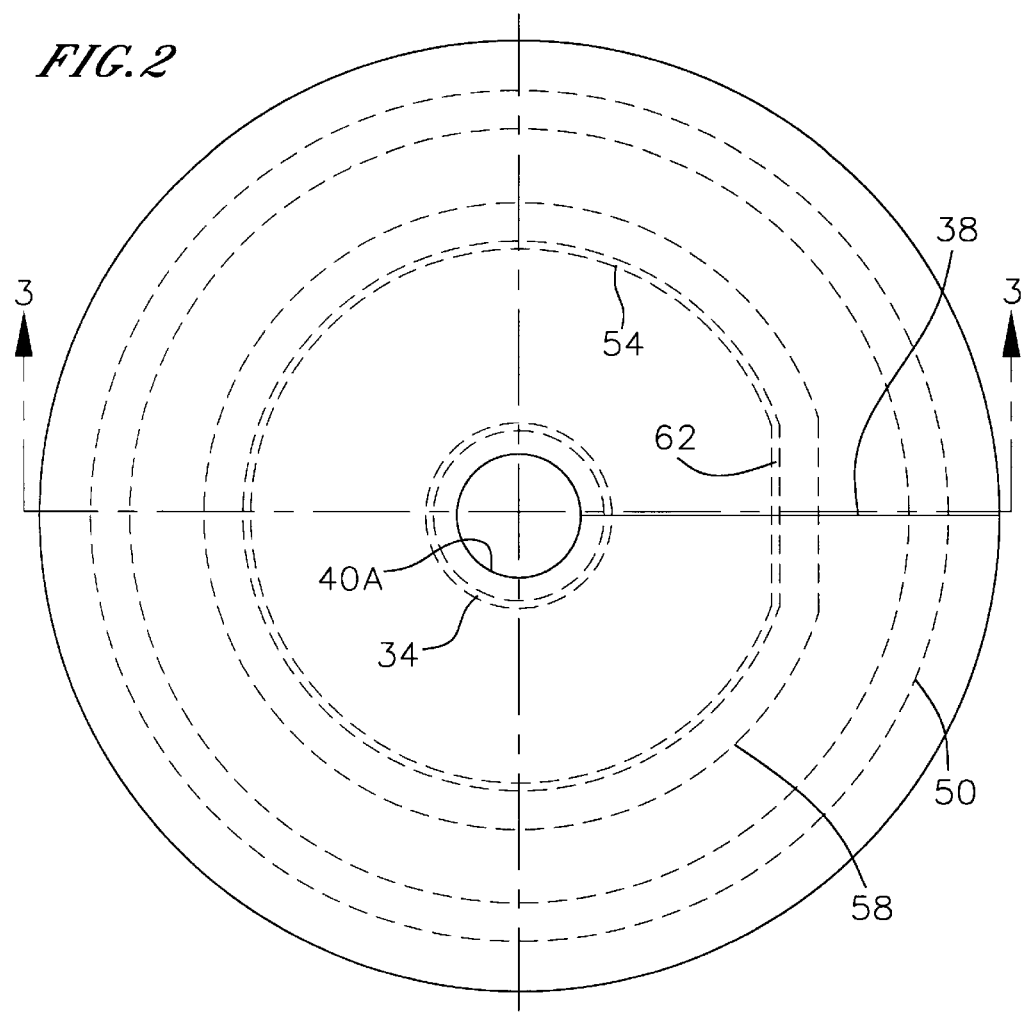
FIG. 2 is a top plan view of a conductive grommet assembly in accordance with one aspect of the present invention.

The second panel engagement wall 56 terminates at an inner tip 58 radially outward of the panel rim contact wall 54. A slanted wall 60 extends between the tip 58 and the radially outermost edge 62 of the inner surface 32. As shown in FIG. 2, the edge 62 is radially outward of the surface 54. As also shown in FIG. 2, portions of the wall 54, rim 58, wall 60 and edge 62 are flat for a distance on each side of the slit 38 so as to form an engagement surface with a correspondingly flat portion in the wall of the panel 22. Other than the flat portions of the walls and rims shown in FIG. 2, the surfaces, edges and rims of the grommet are preferably substantially circular as shown in FIG. 2.

The portion of the grommet between the outer surface 30 and the first panel engagement wall 52 form a flanged portion for extending over the panel and wherein the surface 52 forms an inner surface for contacting a portion of the panel. The conductive portion 26 that is exposed to the panel is preferably an exposed metallic surface for contacting a portion of the panel. The portion of the grommet between the panel rim contact wall 54 and the corresponding portion of the cylindrical wall 34 forms a feed-through portion which is the portion of the grommet which is within the opening in the panel. The feed-through portion extends through the opening in the panel and also includes an exposed metallic surface 64 for contacting the workpiece 20 or other pass-through element. In the preferred embodiment, the metallic surface contacting the workpiece 20 extends a greater distance along the workpiece than corresponds to the thickness of the panel between the surfaces 52 and 56. Preferably, the metallic surface exposed to the workpiece includes an extension 66 also in contact with the workpiece 20. While it is preferred that the conductive portion contacting the work-piece extends toward the inner surface 32, it should be understood that the conductive portion in contact with the workpiece could extend in the opposite direction.

That portion of the grommet extending behind the panel, in other words that portion of the grommet between surfaces 56 and 32, forms a holding portion for holding the grommet within the opening in the panel and for holding the flanged portion against the panel. The three portions preferably combine to form the electrical continuity, and the pressure and fire containment incorporated in one preferred grommet design.

In the preferred embodiment, the grommet includes a fire resistant fabric 68 conventional in these types of grommets. The fabric may be a fabric such as that known in the trade as Nextel. Preferably, the fabric 68 is molded into the flange portion of the grommet and extends from the rim 48 to the cylindrical wall 34 adjacent the outer projection 40.

In the preferred embodiment, the grommet includes a metal insert 70 having a planar portion 72 and an annular portion 74 for providing electrical conduction between the panel and the workpiece. Preferably, the metal insert is circular and substantially continuous except for the slit 38 formed in the grommet. The planar portion 72 extends sufficiently radially outward from the central bore 36 and contacts a sufficient portion of the panel to provide a maximum electrical resistance of 2.5 milliohms with an appropriate conductive material. In the preferred embodiment, the metal insert is formed from a Copper Beryllium alloy, stainless steel or tin plated copper. In the preferred embodiment, the planar portion 72 contacts the panel over approximately ⅓ of the radial length of the planar portion 72 and approximately 50% in the area of the flattened portions of the surfaces 54, 58 and 62.

It should be understood that the grommet can be configured to fit into and seal any number of panel openings, in addition to the D-shaped panel opening for which the grommet shown in FIG. 2 is configured.

While the configuration of the grommet shown in FIG. 3 shows the metallic element as a formed metal insert, such as may be stamped from a sheet, the conductive element may be formed from a conductive mesh, foil, or other conductive material. Additionally, while the conductivity may not be the same, conductivity in the grommet can be achieved by incorporating in the molded grommet conductive particles, conductive paint on the surface of the grommet, and other methods of creating conductivity in the grommet. However, it has been found that a flexible metal plate insert in the grommet achieves the desired resistance of less than 2.5 milliohms. It also should be understood that the metal plate can incorporate discontinuities, such as apertures, ridges, etching or other surface discontinuities to enhance bonding or adhesion between the metal and the elastomeric material of the grommet Preferably, the material of the metal and the shape of the metal is selected to optimize the resiliency and strength of the metal insert and for ensuring good electrical contact between the metal and the work-piece as well as between the metal and the panel.

The grommet of FIG. 3 is preferably formed by conventional molding techniques using a high char yield elastomer such as an appropriate silicone resistant to flame, or other elastomeric or insulating materials. Depending on the application, the material selected can be EPDM, a fireproof or fire-resistant silicon provided by Dow Chemical, fluoroelastomers, butylelastomers, neoprene or nytrile butadienes. The conductive or electrically dissipated element is preferably any metal compatible with aircraft structures and devices used in aircraft, and is preferably thin enough to be flexible, such as 0.005 to 0.010 inches. The insert can be gold or silver plated or tin plated metal, and is preferably compatible with any braiding or other material exposed on the surface of the work-piece. Aluminum and stainless steel can be used but tin-coated Copper Beryllium alloy is preferred as having good conductive properties as well as resiliency. The metal insert is preferably coated with a coupling agent such as Dow-2260 primer over the entire surface of the metal. The fire resistant fabric is included and the grommet molded to produce the configurations shown in FIGS. 2 and 3. The slit 38 is formed in a manner known to those skilled in the art.

The fire resistant fabric is preferably positioned on or near the surface of the grommet that might be expected to be directly exposed to fire. The fire resistant fabric in combination with the elastomer resist flame, making the grommet relatively fireproof The grommet is made to seal against air pressure and moisture by incorporating the angled flange defined by the tip 48. Engaging the grommet in the panel presses the tip 48 against the panel around the entire circumference of the grommet. The material in the flange portion compresses; somewhat and further compresses the circumferential outer projection 40 against the workpiece. The outer and inner projections 40 and 42 also serve to seal around the circumference of the workpiece.

In an alternative embodiment of the grommet (FIGS. 4 and 5), the outer rim of the grommet may be formed with an angled tip 76 for engaging the surface of the panel. The conductive portion of the grommet is a formed or pressed metal sheet, in the preferred embodiment, having a circumferentially extending projection 78 forming a resilient protrusion extending outwardly from the plane of the planar portion 72 of the conductor. The projection 78 helps to provide a reliable electrical contact between the conductor and the panel. The conductor is preferably resilient to allow flexing and adjustment of the contact with the panel as the grommet is being set in place in the panel. A portion of the projection 78 is shown at 80 in FIG. 4.

The annular portion of the conductor which contacts the workpiece is formed in this embodiment 82 in the shape of a partial toroid, as shown in FIG. 5. The inside diameter 84 of the toroid is preferably slightly smaller than the outside diameter of the workpiece, and the inside diameter 86 of the projections 88 is preferably slightly less than the outside diameter of the workpiece in order to ensure good electrical contact and good sealing, respectively. The construction and function of the grommet shown in FIG. 5 is otherwise the same as that shown and described with respect to FIGS. 2 and 3. It should be understood that the conductor shown in FIG. 5 has a thickness, even though no cross-hatching is depicted in the conductor of FIG. 5. It should also be understood that the projection 78 is preferably formed in the conductor by pressing a portion of the sheet out of the normal plane of the planar portion 72 and that the conductor extends to an outer rim 90 near the base of the tip 76.

Where EMI protection is not as significant, the metal insert can be formed with fingers instead of having a substantially 360° circumferential projection 78 for contacting the panel. The use of one or more fingers to contact the panel provides more flexibility in accommodating the payload or work-piece while still maintaining good electrical continuity between the work-piece and the panel. Additionally, using metal inserts according to embodiments described herein, it is believed that greater tolerances in the outer diameter of the work-piece or payload can be accepted than with conventional fixtures.

The projection 78, as well as the use of individual fingers to contact the panel may allow greater flexibility in accommodating different panel thicknesses for the sealing element. However, a continuous projection on the metal insert such as projection 78 extending almost substantially the entire 360° circumference of the insert is preferred in order to ensure suitable electrical contact and no more than 2.5 milliohms of resistance between the work-piece and the panel.

During assembly and formation of the grommet, the toroidal-shaped conductive portion 82 (FIG. 5) may be held in place by mold tooling to prevent flashing of elastomer around the portion of the metal surface which will or which may contact the work-piece or payload. A circular ring having a D-shaped cross section may also be used in the mold to ensure that elastomeric material does not extend into the projection 78 from the flanged portion of the grommet, so that a D-shaped cavity is formed between the projection 78 and the flanged portion of the grommet.

Figure 6:
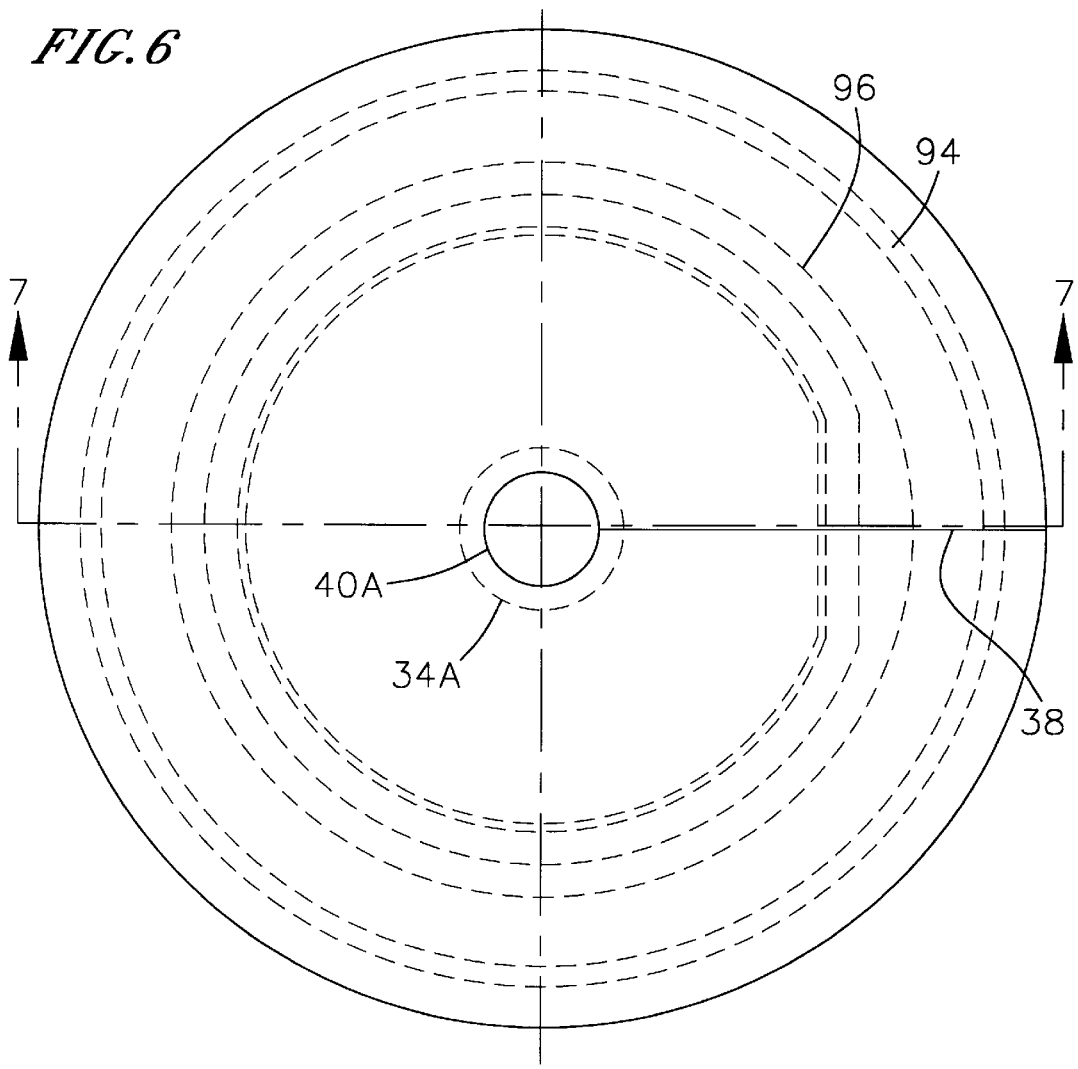
FIG. 6 is a top plan view of a further embodiment of a conductive grommet according to the present invention.
Figure 7:
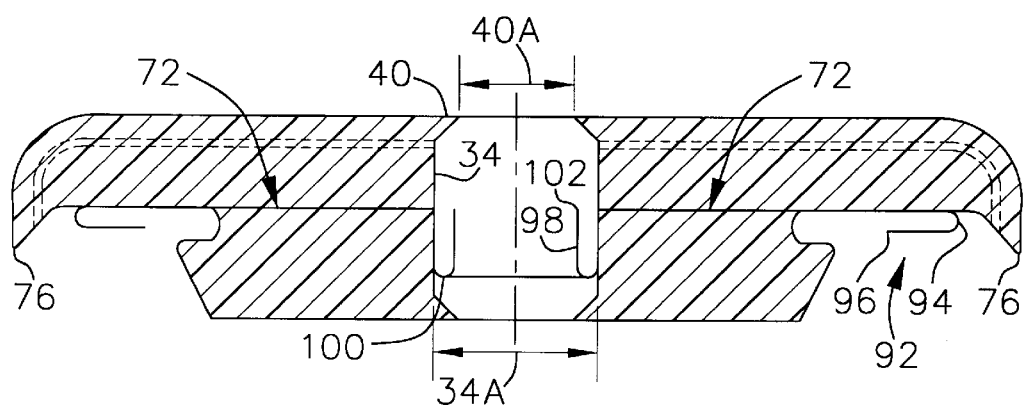
FIG. 7 is a cross-section of the grommet of FIG. 6 taken along line 7—7 of FIG. 6.

In an alternative form of the grommet (FIGS. 6 and 7), the conductor is preferably formed from a Copper Beryllium sheet to have an inwardly turned ledge 92 extending from an outer curve 94 to an inner edge 96. The ledge 92 ensures good electrical contact between the conductor 26 and the panel and provides a bias for the engagement between the flange portion and the panel. The inwardly extending ledge 92 extends circumferentially around the grommet except for the slit 38 formed in the grommet.

The conductor also preferably includes an inwardly positioned biased annular wall 98 formed in the portion of the conductor which extends within the cylindrical wall 34. The wall 98 provides a resilient biased wall extending circumferentially around the cylindrical wall 34 to electrically contact the workpiece over a substantial surface area of the workpiece. Preferably the only discontinuity in the wall occurs at the slit 38. The internal diameter of the wall 98 is preferably the same as the internal diameter 40A of the projections 40. The wall 98 extends from the curved portion 100 upwardly as viewed in FIG. 7 to the edge 102 at the end of the wall 98. The length of the wall 98 is preferably approximately the same as the exposed longitudinal length of the conductor at portions 64 and 66 shown in FIG. 3. However, it is to be understood that the length of the exposed conductive portion in contact with the workpiece may vary as desired to achieve the desired effect of electrical conductivity.

In a further form of the invention, a grommet 102 (FIG. 8) forms a stronger and improved seal relative to the grommet of FIG. 3 using a slanted or sloped outer surface 104 and a slanted or sloped inner surface 106 and, under appropriate dimensional circumstances, more pronounced shoulders 108 and 110. Each feature is believed to contribute to a better seal of the grommet around the workpiece (not shown) passing through the central bore 112, as well as a better seal between the converging rim or tip 114 and the surface of the panel against which the lip 114 presses and seals. An inner rim 116 helps to seal the opposite side of the panel and helps to sandwich the wall of the panel between the outer surface 104 and the inner surface 106 of the grommet.

Considering the grommet 102 in more detail, the grommet has a cover, cap or flanged portion 118 for covering at least an opening in a panel and preferably for extending over the panel and for sealing against the panel. The flanged portion also serves a holding function by holding the grommet in place against any bias generated by the holding element, described more fully below. The flanged portion includes the outer surface 104 to form a first protection surface for the grommet, and an inner surface such as the rim 114 for contacting and sealing against a portion of a panel. In one preferred embodiment, the grommet has an exposed metallic surface, such as the projection 120 for contacting a portion of a panel and forming a conductive bridge or path between a work-piece and the panel. The flanged portion also includes at least one wall, such as that defined by rims 108 and 110, defining an opening for accepting a work-piece, pay load or pass-through element.

The grommet 102 also includes a sleeve, tubing or cable seal or feed-through portion 122 adjacent the flanged portion for extending through an opening in a panel. The feed-through portion includes an exposed conductive surface such as a metallic surface 124 for contacting a cable, tube or other pass-through element to dissipate, or form part of a bridge for dissipating, electromagnetic energy such as electromagnetic radiation or charge or current. The grommet will also preferably include a holding portion 126 for holding the sealing element within an opening in a panel and for holding the flanged portion against the panel. The holding portion will also preferably seal against part of the panel, preferably one surface of the panel, as a barrier to fluids and pressure. The flange portion, the feed-through portion and the holding portion can be considered as being defined by an upper imaginary line 128 and a lower imaginary line 130 separating the respective portions. Generally, the flanged portion will be that portion which extends over the panel on one side, the feed through portion will be that portion which extends within the opening in the panel, and the holding portion will be that portion extending across at least part of the surface of the panel opposite the flanged portion, or at least in some way engaging the panel, to hold the grommet within the opening. Where the function or structure of one ends, if at all, and the function or structure of another begins depends on the particular configuration of the grommet, and may depend on the dimensions, the functions served by the components, and the like.

Considering the flanged portion in more detail, the flanged portion of the grommet includes a fire-resistant fabric 132 extending from the converging wall 114 through and up to the wall defined by the outer rim 108 having the same structure and function as the fabric 68 described above with respect to FIG. 3. The converging wall is formed from an outer curved wall 134 and in inner slanted wall 136, part of the end of which would be contacting a surface of the panel to form a seal with the panel and to place the flanged portion under compression. With the flanged portion under compression, the seal between the converging wall 114 and the panel, and the seal between the outer rim 108 and work-piece, are enhanced. The seals then become a more effective barrier to pressure differentials, fluids and the like.

Figure 11:
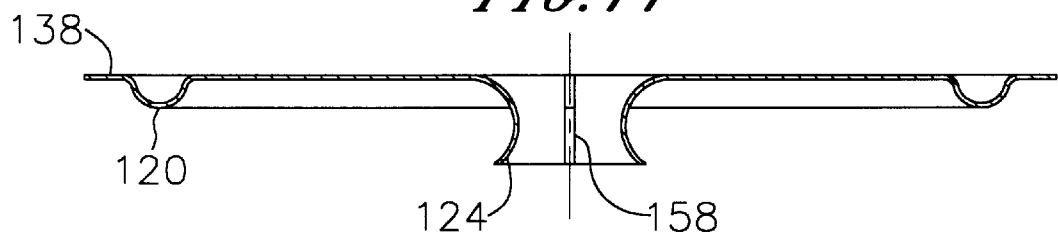
FIG. 11 is a cross section view of a metal insert for use with the grommet of FIG. 8.
Figure 11A:
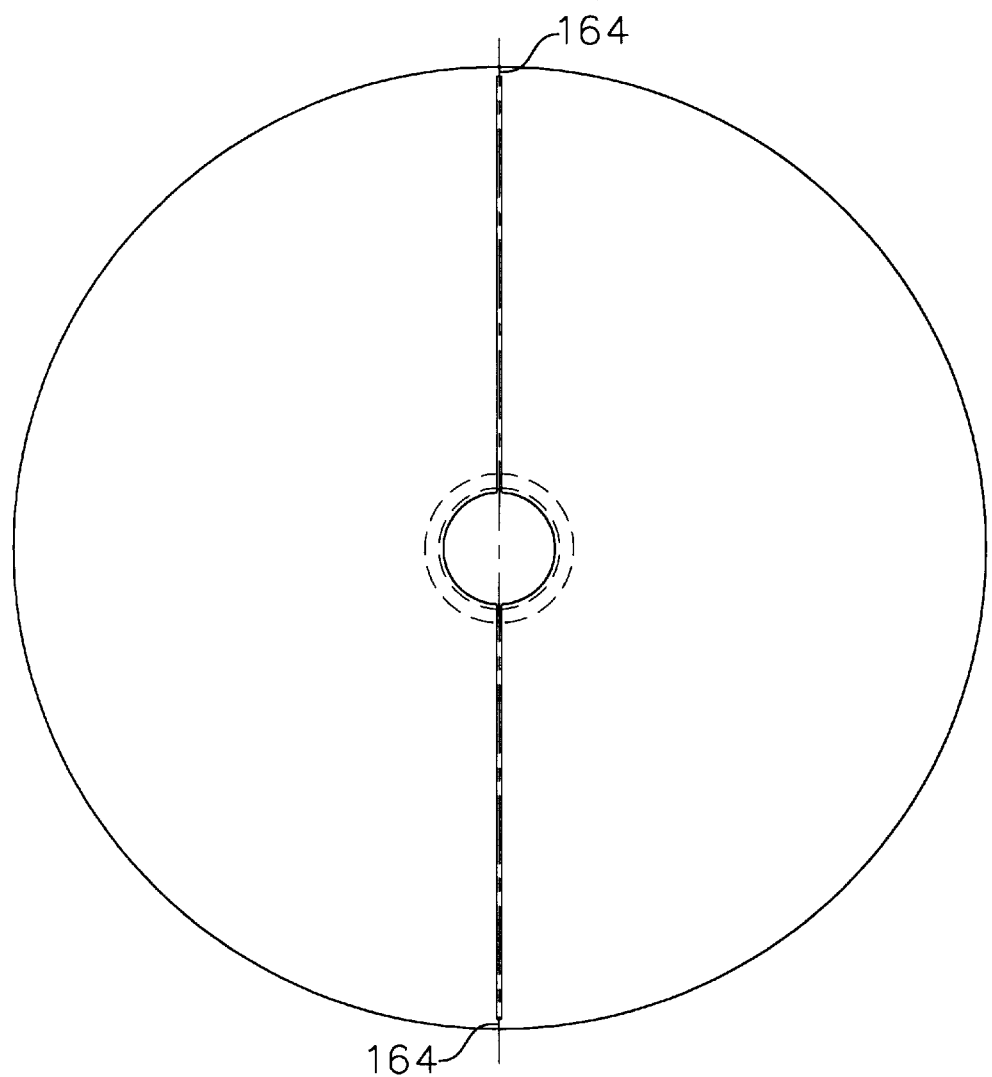
FIG. 11A is a top plan view of a metal insert for use with the grommet of FIG. 8.

The converging wall 114 also serves to protect a conductive element in the firm of the metal insert 138 configured and positioned in a manner similar to the insert 72 described above with respect to FIG. 5. The metal insert 138 (shown also in FIG. 11) is preferably formed as an annulus, in plan view, with a circular projection 120 for contacting the panel, when the grommet is in place. The projection 120 also serves to form an electrically conductive path between the panel and the workpiece which would be in contact with the conductive portion 124 that extends within the feed through portion 122 of the grommet assembly. The metal insert 138 serves as a low resistance, high conductivity element which provides a conduction path between the panel and the workpiece. It also provides a conduction path for any charge dissipation or other electrical effects. The metal insert 138 also provides EMI protection at the panel to prevent or minimize passage of electromagnetic radiation through the opening in the panel. The effectiveness or quantity of EMI protection provided by the metal insert 138 will depend upon the size and extent of any openings, slits, or otherwise in the metal insert. As with the metal insert 70 described above, the metal insert is preferably a tin coated Copper Beryllium alloy tin, 0.010 inches thick. The tin coating is included to ensure compatibility with the braid or enclosure surrounding the workpiece passing through the conductive portion 124. The metal insert is coated with the primer, as discussed above, prior to molding into the grommet assembly.

The outer surface 104 preferably slopes from the rim 108 to the outer extent of the surface at an angle of about 7 degrees and 5 minutes. This slope or slant provides more elastomeric material in the grommet, and provides more support for the engagement by the rim 108 with the work-piece to form a reliable seal. Upon installation of the work-piece, the portion of the material along the outer surface 104 is placed under compression between the rim 108 and the converging wall 114. The relative compression of the material enhances the seal and engagement between the rim 108 and the work-piece. The compression also enhances the engagement of the converging wall 114 with the surface of the panel. The relative compression may also help to bias the flanged portion 118 toward the panel.

Exemplary dimensions for the flanged portion shown in FIG. 8, for an overall outer diameter of the flanged portion of 1.972 inches, include the distance from the uppermost portion of the rim 108 to the interface between the metal insert 138 and the flanged portion of 0.184 inches. The distance from the uppermost portion of the rim 108, hereinafter the datum point, to the lowermost surface of the metal projection 120 is approximately 0.234 inches. The distance from the datum point to the lowermost point on the converging wall 114 may be 0.246 and to the uppermost portion of the inner rim 116 may be 0.264 inches. The distance from the datum point to the lowermost surface of the conductive portion 124 may be 0.344 and the distance from the datum point to the base of the groove 140 may be 0.349. The entire length from the datum point to the lowermost portion of the inner rim 110 may be 0.535 inches.

The flanged portion may also include a locating tab or alignment indicator 142 for providing an indication or guide as to where the grommet should be positioned within the opening, especially where the grommet has a flat 144 formed in the side of the feed through portion 122 to help properly position the grommet within an opening having a corresponding flat. With the flat 144, the portion of the groove 140 adjacent the flat has a greater width than the remaining portion of the groove, such as on the opposite side of the grommet, as seen in FIG. 8.

The entire flanged portion is preferably circular and symmetric about a central axis 146. In other configurations, it is possible that the flanged portion would not be symmetrical about the central axis 146, such as in the grommet configurations shown in and described with respect to FIGS. 16–18.

In the preferred embodiment, the flanged portion also includes the conductive portion in the form of the metal insert 138. In the preferred embodiment, the metal insert 138 forms an interface between the flanged portion 104 and the panel as well as the flanged portion 104 and the feed-through portion 122. In the embodiment shown in FIG. 8, the metal insert is positioned adjacent the flanged portion from the outermost rim portion 148 to the innermost portion of a counterbore 150. At those points, the metal insert defines the lowermost boundary of the flange-portion 104. The metal insert also includes a conductive portion 124 contacting the work-piece passing through the grommet in order to provide electrical continuity between the work-piece and the panel. The conductive portion 124 also provides a conductive junction between the metallic element 138 and the work-piece to minimize the possibility of electromagnetic radiation passing through the opening in the panel.

The conductive portion 124 is shown as extending within the feed-through portion 122 and is shown as having a partial toroidal shape in cross section as viewed in FIG. 8.

The minimum inside diameter of the conductive portion 124 is preferably approximately the same as the minimum inside diameter of the rims 108 and 110. The conductive portion preferably extends through the feed-through portion 122 a distance greater than the thickness of the panel. However, where the panel is relatively thick, the conductive portion 124 need not extend completely through the panel opening. The exposed edges of the conductive portion 124 are preferably directed at least partly away from the central axis 146 so that movement of the conductive portion 124 relative to the work-piece does not cause the exposed edges of the conductive portion 124 to etch, gouge, or scrape the surface of the work-piece. It should be understood that conductivity and EMI protection may be also achieved by having the conductive portion 124 a shorter axial length, or even having the conductive portion extend in the opposite direction, namely outwardly relative to the feed-through portion 122. While it is preferred that the conductive portion 124 extend within the feed-through portion 122, it is possible to have the partial toroidal shape extend in the opposite direction. Extending the conductive portion 124 within the counterbore 150 would still allow the conductive portion 124 and its contact with the work-piece to remain separate from the seal between the rim 108 and the work-piece. Having the conductive contact between the grommet and the work-piece separate from the pressure seal between the grommet and the work-piece, such as through the rims 108 and 110, enhance the integrity of the protection provided by the grommet. The grommet can also be formed such that the conduction portion 124 extends only so far as the inside diameter of the opening in the panel to make electrical contact between the work-piece and the panel. In this configuration, the conductive element need not extend over the face of the panel a significant amount, or even at all. Instead, the conductive bridge between the work-piece and the panel can be made between the work-piece surface and the cut edge or the surface immediately surrounding the opening in the panel. However, the preferred configuration is to have the conductive bridge extend from the work-piece surface to a point near the rim of the flanged portion.

The feed-through portion 122 of the grommet is preferably right circular cylindrical except for the flat 144 and extends a distance from the flanged portion 104 a distance equivalent to the thickness of the panel into which the grommet is inserted. The feed-through portion includes a bore 152 and also may include a portion of the counterbore 154. The bore 152 is preferably larger in diameter than the counterbore 150 to facilitate molding of the grommet assembly and to accommodate the positioning of the conductive portion 124.

The holding portion 126 of the grommet may include all or only a part of the counterbore 154 as well as the bore 156 and the opening defined by the lower rim 110. The angle that the surface of the rim 110, as well as that of the surface 108, makes with the central axis 146 is approximately 45 degrees, in the preferred embodiment. This configuration of the rim 110 provides a reliable seal and, contact between the holding portion 126 and the workpiece.

The inner surface 106 of the grommet is preferably slanted or sloped approximately 16 degrees, 7 minutes, to provide additional elastomeric material in the holding portion and to provide support for the rim 110. The sloped surface also provides support for the inner rim 116 while contacting the adjacent wall of the panel. As with the sloped surface of the flanged-portion 102, it is believed that the holding portion will be under some compression when the grommet is installed in the panel with a work-piece in place.

The inner rim 116 preferably contacts initially the adjacent surface of the panel perpendicular to the panel to form the initial seal between the holding portion 126 and the adjacent panel surface. The rim is spaced from the adjacent wall of the feed-through portion 122 an amount sufficient to permit insertion of the holding portion through the opening in the panel, provide sufficient flexibility in the rim 116 to allow insertion, and to provide sufficient strength in the rim 116 to reliably hold the grommet in place in the opening in the panel. The thickness of the rim 116 is also chosen with these considerations in mind. Exemplary dimensions may have the radius of the outer surface of the feed-through portion 122 approximately 0.507 inches and the radius to the outer surface of the rim 116 0.580 inches. The angle that the inside surface of the rim 116 may form with a vertical may be approximately 12 degrees 34 minutes. The radius to the surface of the flat 144 may be 0.443 inches.

As shown in FIGS. 9 and 10, the metal insert 138 preferably includes a slit or cut 158 extending across a diameter of the metal plate toward opposite edges 160 and 162 while preferably leaving a 0.030 inch expansion, bridge or other form of connection 164 between the two halves of the metal insert almost fully dissected by the cut 158. The slit is preferably 0.012 inches thick, between oppositely facing sides of the cut. The slit is formed for the same purpose as was described above with respect to the other embodiments of the grommet. The slit makes it easier to assemble the grommet about a work-piece and thereafter install the grommet in the opening in a panel. The two connections 164 are maintained in the metal insert during molding and during removal of the grommet from the mold. However, one or both of the connections 164 will be removed, cut or otherwise severed to allow easier separation of the two adjacent quarters of the grommet and to allow insertion of a work-piece or other element through the cut to the opening 112 through the grommet. In the configuration of the grommet shown in FIGS. 8–10, the opposite connection may, but need not be, severed so that the two halves can be moved more easily relative to one another out of the plane of the grommet, while the elastomeric material is still connected to maintain the strength and integrity of the sealing element as it is being assembled on the work piece and installed in a panel.

Also after molding the grommet, a radial cut is made in the grommet coinciding with a radial portion of the slit 158 and extending from top to bottom of the grommet along from a circumferential edge 166 along the radius to the opening 112 in the grommet. By removing the connection 164 and forming the cut in the elastomeric material of the grommet coincident with the same radius of the metal insert, the opposite sides of the cut can be moved out of the plane of the grommet to facilitate insertion of insertion of a work-piece along the cut to the opening 112. The cut in the elastomeric material is shown at 168 and preferably extends axially completely through the elastomeric material coincident with the cut 158 in the metal insert. The cut in the grommet may be achieved using a pneumatically driven blade after the connection 164 is severed either manually or by machine. While the opposite radius in the metal insert may also include a cut, the structural integrity of the grommet is also maintained since the elastomeric material on the other side of the opening 112 is not cut. While it should be understood that the metal insert need not be cut along a diameter, and need not be cut in such a way as to leave only two relatively small connection pieces 164 in the metal insert, at least one fully radial cut is preferably made in the grommet to facilitate assembly of the grommet around a work-piece for installation in an opening in the panel. The pair of connections 164 are preferably maintained until after the molding of the grommet is complete, so as to facilitate positioning and holding the metal insert within the mold. While the cut in the metal insert and the cut in the elastomeric material are shown in FIGS. 9 and 10 as being radial, it should be understood that the cuts can be formed in other directions while preferably still completely severing part of the grommet from the outside edge or surface 166 of the grommet to the opening 112.

The dimensions of the grommet can vary depending upon the thickness of the panel, the available real estate surrounding the opening that can accommodate a flanged portion and holding portion on the grommet, as well as any height restrictions away from either surface of the panel. For example, the feed-through portion may have an outside diameter that is a significant portion, and more than half of, the outside diameter of the flanged portion. Moreover, the flanged portion can have a relatively small outer diameter but it is preferred that the flanged portion outer diameter be greater than the outer diameter of the holding portion so that a portion of the real estate available in the flanged portion can be used for metal or conductive contact with the panel and another, separate part of the flanged portion be available and used for forming a pressure and fluid barrier between the flanged portion and the panel surface. In the configuration shown in FIG. 8, the projection 120 occupies part of the flanged portion interior to the converging wall 114. Having the electrical conductor physically spaced from the pressure and fluid seal permits a more reliable contact for each, unaffected by the other. Similar comments apply to locating the conductive portion 124 spaced from one or both of the rims 108 and 110, so that the contact formed by one with the work-piece is unaffected by the contact formed with the work-piece by the other.

The primary seal formed by the grommet in the opening in the panel is preferably formed through contact between the panel opening and the feed-through portion 122. That seal, against air and liquid, is enhanced by either or both of the contacts formed against the panel by the converging wall 114 or the inner rim 116. For example, having the rim 116 spaced from the outer surface of the feed-through portion may bias the circumferential surface of the feed-through portion outward against the exposed edges of the opening in the panel. It is believed that the hardness and resiliency of the elastomeric material affects the quality and integrity of the seal formed between the exposed wall of the opening in the panel and the feed-through portion of the grommet. It is preferred that there be no metal contact between any metal insert and the panel adjacent the rim 116 in order to minimize the possibility of the presence of any metal part near the seal formed by the rim 116 against the panel.

The metal insert is preferably formed from a Copper Beryllium alloy to provide strength and resiliency in the insert. Resiliency is preferred so that a good contact can be maintained between the conductive portion 124 and the work-piece, as well as between the projection 120 and the panel. It is preferred that good contact be maintained even under a variety of adverse conditions, such as vibration, impact, and the like. It is also preferred that the metal insert be continuous about the circumference at all locations on the insert except for the slit or cut formed in the metal insert to facilitate proper installation of the grommet about the work-piece and in the panel. The preferred slit dimension of 0.012 inch is still sufficiently small to adequately block electromagnetic interference.

In a further alternative embodiment for a sealing element, a sealing element 170 (FIG. 12) is used to seal an opening in a panel. The sealing element includes a flanged portion 172 for extending over a panel (not shown), wherein the flanged portion includes an outer surface 174 an in inner surface 176 for contacting a surface of a panel. The outer surface 174 of the flanged portion may be flat or slanted or peaked in manners similar to those described above with respect to previous embodiments. The inner surface 176 may include a converging wall portion 178 such as a circular rim, point or the like, for forming a reliable seal against pressure and fluid between the flanged portion and the panel.

In the preferred embodiment, the sealing element includes an exposed conductive surface such as at 180 for helping to block electromagnetic radiation. In the preferred embodiment, the exposed conductive surface is positioned adjacent the inner surface 176 of the flanged portion for contacting a portion of a panel. The projection 180 will block electromagnetic radiation to the extent that it is sized and configured in such a way to block EMI, but EMI will not be blocked to the extent of any significantly sized openings through the conductive surface. Therefore, the exposed conductive surface is preferably electrically conductively coupled to an EMI blocking element 182 in the form of a disk formed integral with or coextensive with the projection 180 extending circumferentially around the grommet. Since the sealing element will be used substantially as a plug to seal an opening in a panel, and would not include any work-piece, no slit or cut is made in the element 182. The underside, and the positioning of the elements 180 and 182 relative to the flanged portion 172 are similar or identical to that described above with respect to FIGS. 3–10.

The sealing element may also include a feed-through portion 184 and a holding portion 186 having functions similar to those elements described above with respect to FIGS. 8–10. The portions 184 and 186 may include a flat 188 for positioning the plug in aa D-shaped opening and a locating tab 190 to visibly mark the orientation of the grommet for proper positioning.

The holding element includes an inner surface 192, which may be flat or peaked, as desired, and a rim 194 for holding the grommet against the panel. The rim 194 can have a structure and function similar to that described above with respect to FIG. 8. The holding portion may include a wall 196 for defining a cavity 198 extending into the holding portion and partly into the feed-through portion for making it easier to install the plug in an opening in the panel. The cavity allows the walls of the holding portion to flex inwardly to accommodate the dimensions of the opening in the panel. The cavity also allows a lower total weight of the grommet.

Figure 12:
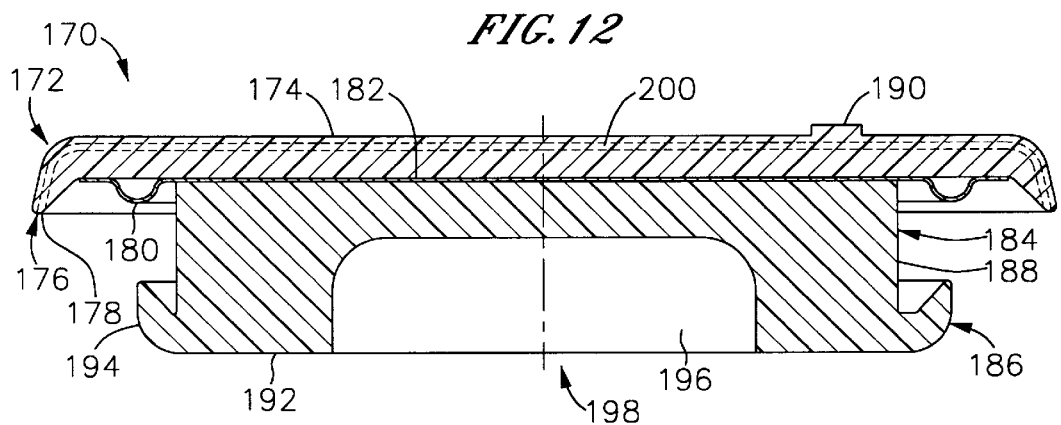
FIG. 12 is a cross-sectional view of a grommet, plug or insert in accordance with a further aspect of the present inventions.

A sealing element such as that described with respect to FIG. 12 is a suitable replacement for panel closures which traditionally used rivets, plates and sealing compounds to cover an opening. The plug can be formed by molding and installed and maintained in a manner similar to the grommets described above with respect to FIGS. 1–11. The materials can be the same or similar as those described for use with the grommets of FIGS. 1–11 and the plug may also include a fire resistant or similar fabric 200 having characteristics similar or identical to those described above. The sealing element described provides protection from electromagnetic radiation, and seals against fluids and gases and pressure differentials across the panel.

Grommets according to the present invention can be configured to have a variety of different sizes to seal a respective variety of panel openings. Additionally, grommets can be designed to have a variety of different single or multiple openings for accepting respective dimensions of work-pieces. The elements of the flanged portion can be modified in a number of different ways, such as those shown in the drawings, and one size of grommet may best use a particular configuration of flanged portion and conductor configuration, while another size may work best with a different combination. Similar comments apply with respect to the feed-through portion and the holder portion. Additionally, the configurations of the rims, bores and counterbores can be modified to suit the size, configuration and construction of the particular work-piece the grommet surrounds.

Figure 13A:
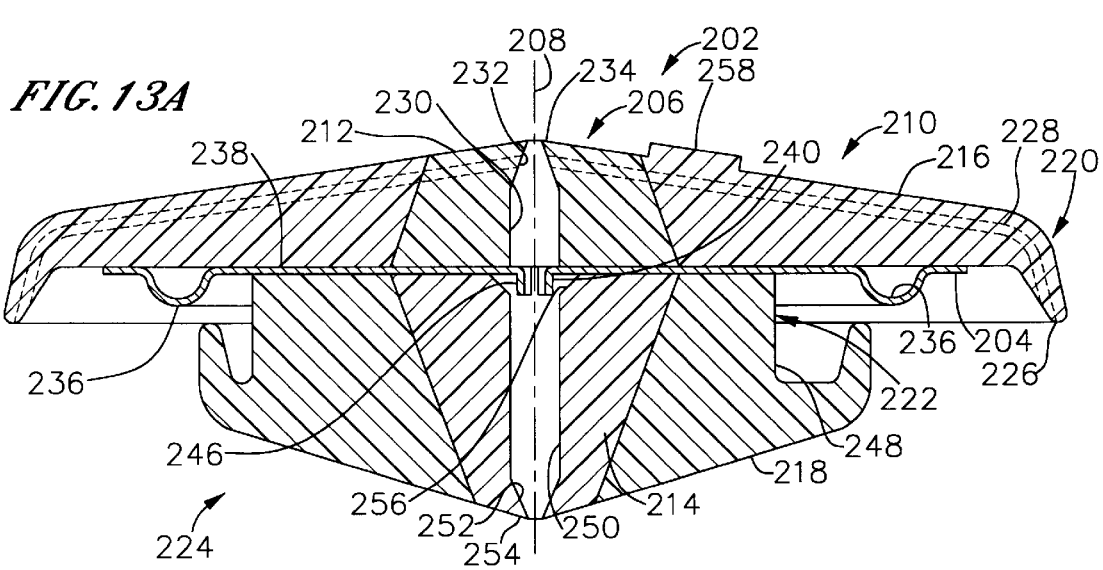
FIG. 13A is a cross-sectional view of the grommet of FIG. 13.

For particularly small diameter work-pieces, the grommet may have a three, four or more-part construction to facilitate assembly and molding of the grommet assembly. As shown in FIG. 13A, the grommet assembly has a four part elastomer body along with the conductive insert 202. The four piece grommet 202 includes a central body portion 206 symmetrically oriented about a central axis 208 around which is formed an annular body 210. The central body portion 206 includes an upper portion 212 and a lower portion 214. The annular body portion 210 includes an upper body portion 216 and a lower body portion 218. Each of the upper and lower body portions are separated by the conductive insert 204 about which the upper and lower body portions are molded.

The upper body portions 212 and 216 form the flanged body part 220 and the upper section 222 of the lower body portions 214 and 218 form the feed-through body portion. The lower part of the lower body portions 214 and 218 form the holding portion 224.

The outwardly facing surface of the flanged body portion 220 is comparable in structure and function to the outer surface 104 in the grommet described with respect to FIG. 8. For example, the flanged body portion contacts the adjacent panel wall through converging rim portion 226 and includes a fire resistant fabric 228.

The upper portion 212 of the annular body 210 is formed substantially as a peaked trapezoid with a first bore 230 extending upward from the conductive element 204 to a conical bore 232 forming the rim 234 for engaging and sealing against a workpiece passing through the opening, defined by the bores 230 and 232. The rim 234 seals against the work-piece in a manner similar to that described above with respect to the rim 108 in FIG. 8.

The conductive element 204 includes projections similar to those described above with respect to projections 236 and a planar disc portion 238 extending toward the center to a cylindrical collar 240 for contacting and electrically engaging a circumferential surface on the work-piece passed through the bore or opening defined by the bores 230 and 232. The projections 236 and the planar disc portion 238 extend circularly around the grommet except for a slit or cut 242 extending almost the entire diameter of the disc except for connector portions 244. The connector portions 244 are formed or left in the disc at diametrically opposite sides of the disc in order to hold the conductor portion together while assembling and molding the grommet assembly. After molding, preferably both of the connector portions 244 are cut and the elastomeric material in the grommet can be cut through, coincident with the slit 242, to permit insertion of the work-piece in the passageway defined by the bore and counterbore. The cut also divides the cylindrical collar into symmetrical halves.

The cylindrical collar includes substantially straight walls 246 for contacting the workpiece. Straight walls are used to minimize the amount of space taken up by the conductive portion of the conductive insert surrounding the work-piece. Straight walls also facilitate molding and separation of the mold pieces after curing.

The lower annular and outer body portions are formed substantially symmetrically about the central axis 208, except for a flat 248 used to orient the grommet in a correspondingly keyed opening in a panel. The lower annular portion 214 includes a bore 250 having an inside diameter substantially the same as the inside diameter of the bore 230 terminating in a conical bore 252 defining a rim 254 for engaging and sealing against a circumferential portion of the work-piece. The lower annular body portion also includes a counter sink surface 256 for facilitating molding of the grommet assembly. The lower annular body portion is preferably substantially trapezoidal in cross section except for the slanted outer surfaces about the axis 208. The lower outer annular body portion is formed about the lower central body portion to form the feed-through portion and the holding portion. The grommet may also include an indicator tab 258 to visually show the location of the flat 248.

The grommet 202 of FIG. 13 is particularly suited to sealing about small work pieces, such as those having a diameter as small as approximately 0.020 inch. It may accommodate work-pieces slightly larger and slightly smaller, and still adequately seal about the work-piece.

The metal insert 238 is fabricated or formed in a manner similar to the inserts described previously in that the slit or cut 242 is preferably formed on a diameter while still leaving oppositely disposed connections 244 between each end of the slit and the respective outer circumferential surface of the metal insert. Once the grommet assembly is formed, one or both of the connections 244 can be cut or severed in order to permit insertion of a work-piece into the opening. One radius of the elastomeric material may also be cut as previously described. In the preferred embodiment, the inside diameter of the cylindrical collar 240 is approximately 0.030 inch.

The same features and benefits of EMI protection, electrical conductivity, pressure and fluid sealing provided by the grommets described above for a single work-piece or for a plug can also be provided by grommets that accommodate two or more work-pieces. Such a grommet 259 (FIGS. 14 and 15) could accommodate two or more work-pieces for a single opening where conventional irises would require that the two or more work-pieces be bundled into a single work-piece. Such a grommet would preferably have a flanged portion 260 (FIG. 15). It would also preferably include an electrically conductive portion 266 for contacting a portion of the panel into which the grommet is inserted and a work-piece passing through the grommet so as to provide either or both EMI protection and low electrical resistance between the two.

The other elements of the grommet 259 are preferably similar to or the same as the corresponding elements described above with respect to grommets having a single opening. The grommet 259 preferably includes a converging wall 268, an outer surface 270, which may be sloped or flat, a semi-circular projection 272 on the metal insert 266 for contacting the surface of the panel around an area preferably defining a circle and fabric 274 for fire resistance. The flanged portion 260 is preferably circular in plan view, as shown in FIG. 14, as is the feed-through portion 262 and the holding portion 264. A flat (not shown) is also included if the panel opening includes a flat. The holding portion 264 preferably includes a holding surface in the form of the rim 276 and the slanted surface 280 for permitting more material in the holding portion 264 and for allowing a better seal between the holding portion and the work-piece and between the rim 276 and the panel surface.

The grommet 259 is shown in FIGS. 14 and 15 as being a grommet for accommodating two work-pieces. In this configuration, the grommet would have first and second feed through openings 278 and 280, respectively, for sealing around each respective work-piece, forming an electrical contact with each respective work-piece, and for permitting each respective work-piece to pass through the grommet. Each feed through opening includes rims 282 and 284, respectively, in the outer surface 270 and rims 286 and 288 in the lower surface of the holding portion 264, respectively. Each opening includes a bore 290 and 292, respectively, in the flanged portion for forming part of the opening, and bores 294 and 296, respectively, in the holding portion for forming an additional part of the first and second openings. Counterbores 298 and 300, respectively, are formed in the feed-through portion 262 and preferably part of the holding portion 264 to accommodate respective conductive elements 302 and 304, respectively, for ease of molding and electrical coupling with the respective work-pieces. The dimensions, functions and characteristics of each of the first and second feed-through openings 278 ad 280 are preferably similar or identical to those described above with respect to a single opening.

Preferably, the first and second openings 278 and 280 are centered colinearly on a diameter 306 of the grommet and are positioned equidistant from a perpendicular diameter 308 so as to provide balance and symmetry to the locations of the openings so that the grommet can better support and seal the work-pieces under anticipated operating conditions. In this embodiment of the grommet 259, the outer surface of the flanged portion 260 is preferably flat between the first and second openings.

As with previously described embodiments of the metal insert, the metal insert 266 for the grommet 259 is preferably slit along the diameter 306 while still leaving oppositely positioned connections 310 to facilitate molding and to provide structural integrity for the insert. After the grommet assembly is formed, both of the connections 310 are cut or removed so as to permit insertion of the respective work-piece in each of the first and second openings 278 and 280. Additionally, the elastomeric material overlying each cut in the metal insert is also cut to the extent from the circumferential edge of the grommet inwardly along the diameter 306 to the respective opening. The elastomeric material between each of the openings is not cut, to thereby maintain the structural integrity of the grommet. Once the grommet is formed, the respective work pieces extending through the panel can be inserted into respective openings in the grommet, and the grommet can be slid along the work-pieces and inserted into the opening of the panel to be sealed.

Generally, each opening in the grommet will have a complete slit running from the opening outward to the outer circumferential edge of the metal insert when the grommet is ready for final assembly, without any 0.030 inch connection across the end of the slit, and the elastomeric material overlying the slit between the opening and the circumferential edge of the grommet is also cut, so as to allow insertion of the respective work-piece. Where a given opening is positioned on a diameter but not in the center of the grommet, the remaining elastomeric material overlying any slit in the metal insert will not be cut from the opening to the center of the grommet.

The grommet 259 shown in FIGS. 14 and 15 will accommodate and seal two workpieces and provide electrical conductivity between each work-piece and the surface of the panel through which the work-pieces pass. Such a grommet provides greater flexibility for designers and technicians in that multiple work-pieces no longer need be bundled together into a single bundle or a work-piece in order to pass through a single opening in a panel. Discreet and separate bundles can now pass through the same panel opening without having to be bundled, and those same workpieces no longer need be permanently joined by the mere requirement that they were conventionally included in a single bundled work-piece. Each work-piece can be routed in different directions after passing through the grommet.

It should be understood that the two or more openings can be positioned, dimensioned and/or configured in any number of ways while still achieving EMI and/or electrical conductivity protection as well as sealing. The other dimensions and configurations of the grommet can also be varied while still achieving the purposes and functions desired in the grommet.

It should be understood that during molding of the grommet assembly, elastomeric material may extend into the slit between opposite halves of the metal insert. The exposed oppositely facing edges of the metal insert formed by the cut or slit may be entirely covered or only partially covered, if at all. Additionally, it should be understood that if EMI protection is not necessary, the metal insert can have a larger slit than previously described, may have openings or apertures, or other discontinuities, while still maintaining electrical conductivity or low resistance between the panel and the work-piece.

By way of example, a grommet 312 (FIGS. 16–18) may be configured to accommodate more than one work-piece, and where at least one of the work-pieces is sized differently from the others. Preferably, the grommet 312 also includes a flanged portion 314, a feed-through portion 316 and a holding portion 318 having structures, functions and effects similar to or the same as those described above. The grommet 312 also preferably includes a conductive portion 320, a converging wall or rim portion 322, an upper surface 324, and a circular projection 326 on the metallic insert 320 also having structures, functions and results similar to those previously described. The flanged portion also preferably includes a fire resistant fabric 328 similar to those described above. The holding portion also preferably includes a rim or wall spaced from the feed-through portion 316 to provide an appropriate seal and bias between the grommet and the adjacent panel surface.

The grommet also preferably includes a first feed-through opening 342, a second feed-through opening 344, and a third feed-through opening 346 for accommodating, sealing against and electrically contacting respective work-pieces (not shown). Each opening preferably includes respective rims 348, 350 and 352 in the flanged portion and rims 354, 356 and 358, respectively, in the inner surface of the holding portion 318 for sealing around and engaging the respective work-pieces. The first feed-through opening also includes its bores 360 and 362, and counterbore 364 to accommodate the conductive portion 366 which contacts and forms a conductive bridge between the work-piece and the metal insert. The second opening 344 also includes respective bores 368 and 370 and counterbore 372 to accommodate the conductive portion 374. The structures, functions and results provided by these elements are similar to those previously described with respect to other embodiments.

The third feed-through opening 346 includes a first bore 374 and a first counterbore 376 in the flanged portion above the metal insert, and a second bore 378 and a second counterbore 380 in the holding portion 318 and the feed-through portion 316, respectively. The second counterbore accommodates the conductive portion 382 for electrically contacting and forming a conductive bridge between the work-piece passing through the third opening 346 and the metal insert.

Figure 16:
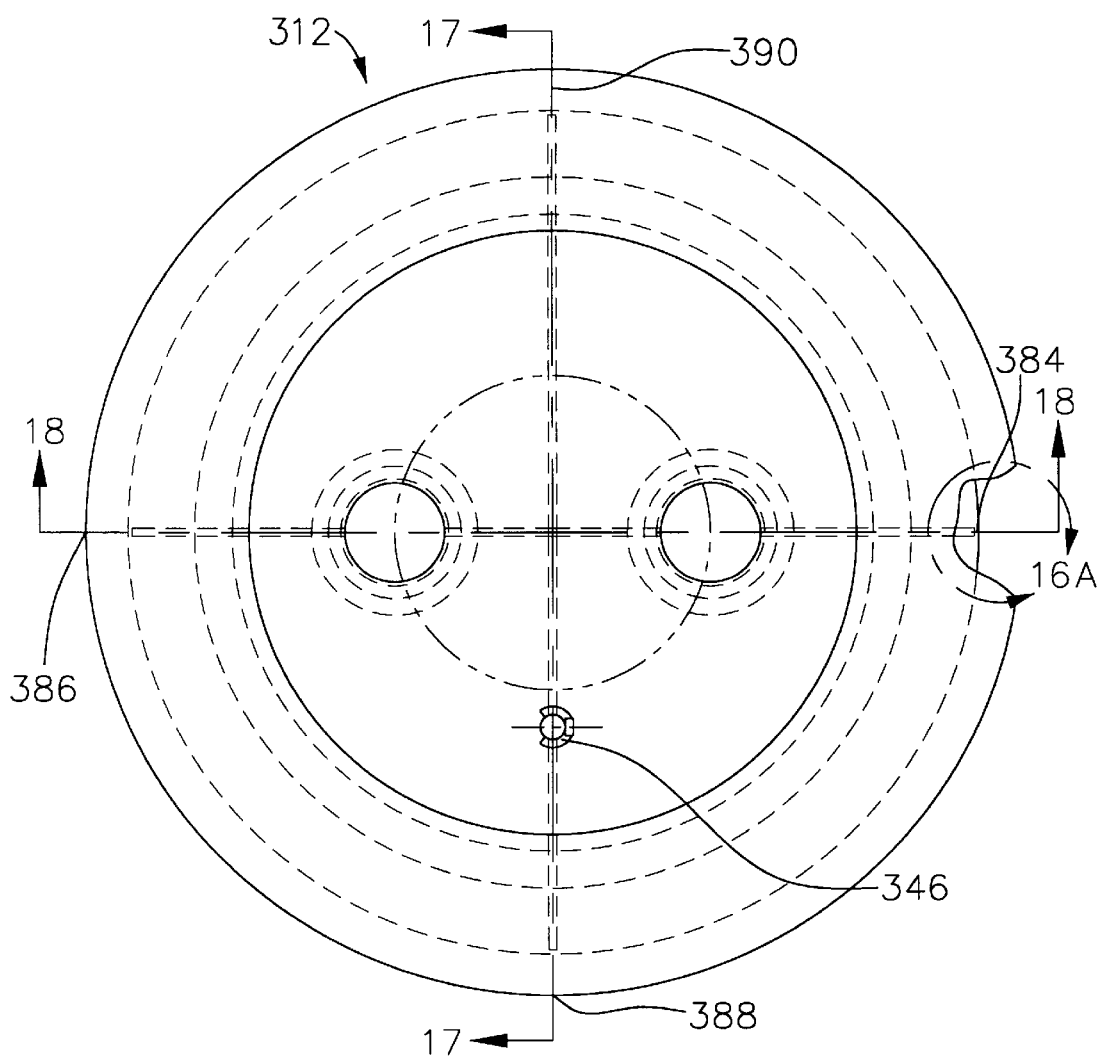
FIG. 16 is a top plan view of a further grommet according to additional aspects of the present inventions for accommodating multiple workpieces.
Figure 16A:
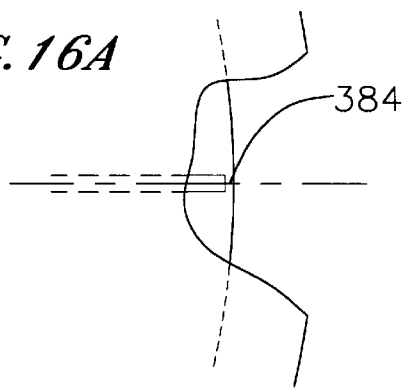
FIG. 16A is a detail and partial cutaway view of a rim portion of the grommet of FIG. 16.
Figure 17:
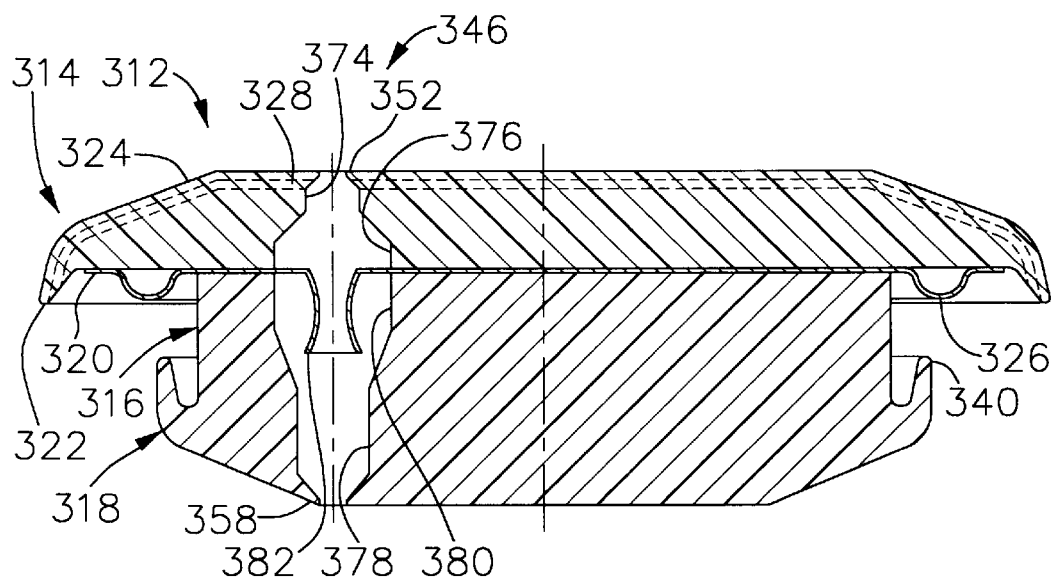
FIG. 17 is a cross-sectional view of the grommet of FIG. 16 taken along lines 17—17 of FIG. 16.
Figure 18:
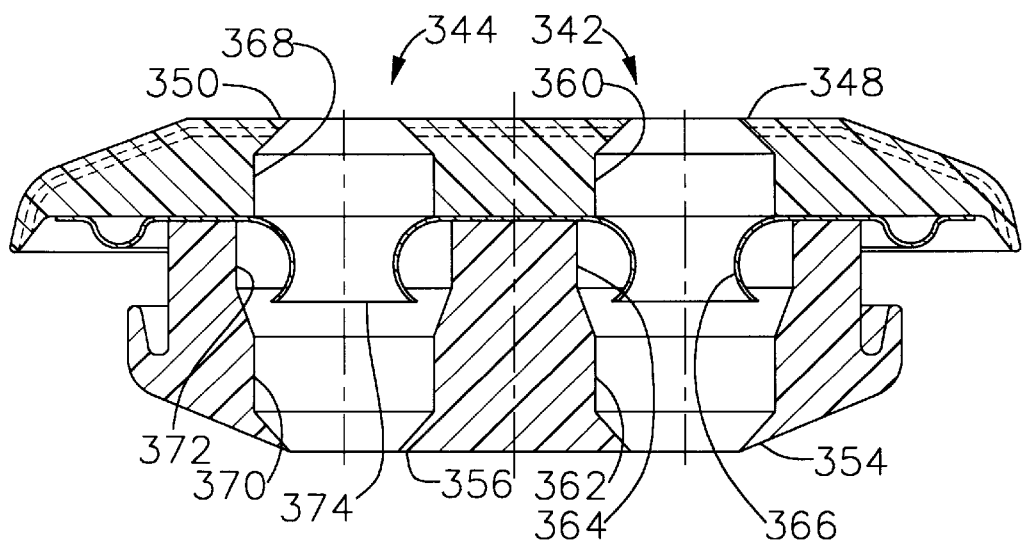
FIG. 18 is a further cross-sectional view of the grommet of FIG. 16 taken along the lines 18—18 of FIG. 16.

With the embodiments of the grommet shown in FIGS. 16–18, as with that shown in FIGS. 14 and 15, the grommet can accommodate more than one workpiece, seal and protect the opening and the work-pieces passing through that single panel opening, while permitting the several work-pieces to remain unbundled with respect to each other. While any given work-piece can be a bundle of several cables or other devices passing through a panel, multiple feed-through openings in a grommet permit more flexibility in designing and implementing aircraft and other systems having cables and other devices passing through panels, bulkheads and the like.

As with other embodiments, the metal insert of the grommet 312 includes a preferably 0.012 inch slit along a diameter which includes any of the feed-through openings 342, 344 and 346. Each diameter includes its respective pair of oppositely disposed connections or bridges 384, and 386 on the diameter containing the first and second feed-through openings, and 388 and 400 on the diameter containing the third opening. After the grommet assembly is molded, the bridges 384 and 386 are removed or severed to allow insertion of a respective workpiece into the first and second openings 342 and 344 and the elastic material overlying the slits between the first opening 342 and extending to the outer circumference of the flanged portion 314 is cut. The bridge 386 is removed or cut as is the elastomeric material overlying the slit between the second feed-through opening 344 and extending out to the circumferential edge of the flanged portion 314 adjacent the bridge 386. The elastomeric material between the first and second openings 342 and 344 remains intact. Likewise, the bridge 388 is removed or cut and the elastomeric material overlying the slit between the third opening 346 and the slit out to the severed bridge 388 as well as to the circumferential edge of the flanged portion 314 adjacent bridge 388 is cut to allow insertion of a work-piece into the third opening 346. The elastomeric material extending toward the center of the grommet and out to the bridge 390 remains intact.

The relative spacing and positioning of the feed through openings in a multiple opening grommet can be varied as desired while preferably positioning the openings along a diameter on the grommet and spaced sufficiently apart to maintain an adequate seal between the grommet rims and the work-piece and to maintain electrical continuity in the metal insert. While the openings are preferably symmetrically oriented about the center of the grommet and about diameters on the grommet, it is possible that the feed-through openings can be otherwise arranged.

The metal insert (see FIGS. 19–21 corresponding to the grommet of FIGS. 16–18) can be formed in a manner similar to that described above with respect to previous embodiments so that there are multiple conductive portions extending out of the plane of the metal insert having the necessary dimensions corresponding to the particular work-piece to pass through the respective conductive portion. In an alternative embodiment, one or more of the conductive portions can be formed separately and welded, attached or otherwise electrically connected to the planar portion of the metal insert in order to provide electrical continuity between the work-piece and the panel surface. For example, the second conductive portion 374 may be formed from the metal insert and be integral with the metal insert while the first conductive portion 366 may be formed separately and attached to a surface 392 pressed from the surface of the metal insert. The conductive portion 366 includes a flange 394 for mounting to the surface 392. The overlap between flange 394 and 392 is preferably sufficient to ensure adequate electrical conductivity. Alternatively, instead of stamping or extruding and/or welding, the insert may be formed by metal spinning, such as can be done by Canyon City Model of Azusa, Calif. Metal spinning permits more uniform metal thickness across the metal insert for some. configurations, such as for narrow or small openings in the metal.

A second surface 396 is pressed from the metal insert to accept a corresponding flange 398 on the third conductive portion 382 for mounting, welding or otherwise attaching the third conductive portion 382 to the metal insert to ensure electrical conductivity between the conductive portion 382 and the metal insert. Alternatively, each of the conductive portions 366, 374 and 382 can be formed separately from the metal insert and welded, bonded or otherwise electrically coupled to the metal insert for providing electrical continuity between the respective work-pieces and the surface of the panel contacted by the metal insert.

As described above, a grommet is provided which gives electrical continuity between and/or EMI protection for a work-piece and a panel such as in aircraft electrical systems or tubing feed-throughs, for example for tubing or electrical cables penetrating the web of a structural member or containment wall. In the preferred embodiment, the grommet provides not only electrical continuity but also EMI protection and pressure and fire containment. The grommets of the present invention can be easily molded and preferably result in a single piece part. They are preferably lower in cost, lighter in weight and require less time for installation, repair and maintenance. The grommets are also resistant to moisture and corrosion, and provide pressure and fire containment without the need for sealants, potting or adhesives. While it is possible that sealants, potting or adhesives can be used with the grommet of the present invention, it is not believed that such compounds are required. No special tools, solvents or sealants are required to install or maintain the assembly using the grommets of the present invention. The sandwiched elastomer construction is easily slit to readily fit over cables and tubes upon insertion into an aperture in a structural member or wall. In a preferred embodiment, the grommet provides suitable electrical continuity by means of a thin electrical contact extending through much of the grommet. Also in the preferred embodiment, the contact extends from direct contact with the workpiece outwardly through the grommet into electrical contact with the panel or other structure. The grommets provide a substantially 360° conductive path between the cable or tube and the structure through which the cable or tube passes. The conductive path is such that it provides a maximum electrical resistance of approximately 2.5 milliohms. Using conventional elastomers and fire resistant fabrics, the grommets having the construction described can meet industry standard fire containment requirements to resist single side impingement of a 2,000° Fahrenheit/4500 BTU per hour flame for 15 minutes without burn-through or backside ignition.

Although the present inventions have been described in terms of the preferred embodiments above, the described embodiments of the invention are only considered to be preferred and illustrative of the inventive concept; the scope of the invention is not to be limited or restricted to such embodiments. Various and other numerous arrangements and modifications may be devised without departing from the spirit and scope of the inventions. Accordingly, the present invention is not limited to those embodiments precisely shown and described in the specification. It is intended that the scope of the present inventions extends to all such modifications and/or additions and that the scope of the present inventions is limited solely by the claims set forth below.

We claim:

1. An electrically conductive sealing element for sealing a pass-through element in a panel, the sealing element comprising:
    a flanged portion for extending over a panel, the flange portion including an outer surface, an inner surface for contacting a portion of a panel and an exposed metallic surface in the inner surface for contacting a portion of a panel, and a wall defining an opening for accepting a pass-through element, wherein the flange portion is formed from an elastomeric material;
    a feed-through portion adjacent the flange portion for extending through an opening in a panel wherein the feed-through portion includes an exposed metallic surface for contacting a pass-through element; and
    a holding portion for holding the sealing element within an opening in a panel and for holding the flange portion against a panel.

2. The element of claim 1 wherein the exposed metallic surface in the flange portion is electrically connected to the exposed metallic surface in the feed-through portion.

3. The sealing element of claim 2 wherein the exposed metallic surfaces are formed as an integral metallic conductive element imbedded in the sealing element between the flanged portion and the holding portion.

4. The sealing element of claim 3 wherein the exposed metallic surface in the flanged portion is substantially planar.

5. The sealing element of claim 4 wherein the planar metallic surface includes a surface discontinuity for electrically contacting the panel surface.

6. The sealing element of claim 5 wherein the discontinuity is a semicircular bulge extending around at least a portion of the metallic surface.

7. The sealing element of claim 3 wherein the exposed metallic surface in the feed-through portion is substantially cylindrical.

8. The sealing element of claim 7 wherein the cylindrical surface is curved.

9. The sealing element of claim 3 wherein the metallic surface in the flanged portion includes at least one projection for contacting a panel.

10. The sealing element of claim 9 wherein the projection is formed from a curved metal portion.

11. The sealing element of claim 10 wherein the curved portion is formed from a metallic portion bent back on itself.

12. The sealing element of claim 2 wherein the metallic surface is formed from a Copper Beryllium alloy.

13. The sealing element of claim 1 wherein the flanged portion and the holding portion are formed from an elastomeric material.

14. The sealing element of claim 13 wherein the elastomeric material is silicone.

15. The sealing element of claim 1 wherein the flanged portion and the holding portion are formed from a flexible electrically insulating material.

16. The sealing element of claim 1 wherein the exposed metallic surface adjacent the inner surface of the flanged portion is a first metallic surface and the exposed metallic surface adjacent the feed-through portion is a second metallic surface and wherein the first and second metallic surfaces are welded together.

17. A sealing element for sealing an opening in a panel, the sealing element comprising:
    a cover portion for extending over a panel, the cover portion including an outer surface, and an inner surface for contacting a portion of a panel;
    a conductive material suitable for blocking electromagnetic radiation adjacent the inner surface of the cover portion and at least partly exposed for contacting a portion of a panel; and
    a holding portion for holding the sealing element within an opening in a panel and for holding the cover portion against a panel.

18. The sealing element of claim 17 wherein the conductive material includes conductive mesh.

19. The sealing element of claim 17 wherein the conductive material includes conductive particles dispersed in the cover portion.

20. The sealing element of claim 17 wherein the conductive material includes a metal plate.

21. The sealing element of claim 20 wherein the conductive material includes an outer edge that is substantially circular.

22. The sealing element of claim 17 wherein the cover element further includes a fire resistant fabric.

23. The sealing element of claim 17 wherein the cover portion is substantially circular.

24. The sealing element of claim 17 wherein the holding portion is substantially circular.

25. The sealing element of claim 17 wherein the conductive material includes a substantially circular metal element having a first wall defining an opening through the metal element and a second wall extending radially outwardly from the first wall.

26. The sealing element of claim 25 wherein the first wall extends away from the second wall and has a curvature so that the first wall defines a diameter and wherein the first wall has a diameter near the second wall and has a smaller diameter further away from the second wall.

27. The sealing element of claim 25 wherein the second wall includes a substantially planar portion extending over a portion of the cover portion and further includes a contact portion that extends in a direction so as to contact a panel when the sealing element is placed in an opening in a panel.

28. The sealing element of claim 25 wherein part of the cover portion sandwiches part of the second wall.

29. The sealing element of claim 20 wherein the metal plate includes a curved protrusion extending from the surface of the metal plate for contacting a surface of the panel to be contacted and extending around the plate.

30. The sealing element of claim 20 wherein the metal plate is unperforated except for a cut formed in the plate.

31. The sealing element of claim 30 wherein the metal plate has two walls defining the cut and wherein the metal plate further includes a cylindrical wall defining an opening and the cut extends from the circular wall radially outwardly.

32. The sealing element of claim 31 wherein the cut separates the metal plate into two halves.

33. The sealing element of claim 17 wherein the cover portion and the holding portion are formed from an elastomeric material, and wherein the holding portion includes a wall spaced from the rest of the holding portion and defining a recess so that the holding portion is flexible and can flex upon insertion of the holding portion into an opening in a panel.

34. The sealing element of claim 33 wherein the holding portion includes a base spaced from the cover portion and wherein the wall of the holding portion includes a base portion connected to the base of the holding portion.

35. The sealing element of claim 17 wherein the inner surface of the cover portion includes a converging tip extending from the cover portion in a direction at least partly away from the outer surface.

36. The sealing element of claim 35 further comprising a metal plate and wherein the conductive surface is part of the metal plate and wherein the metal plate includes a rounded protrusion extending from the surface of the metal plate for contacting a surface of the panel to be contacted and extending around the plate to form a circle in the plate, wherein the protrusion extends a first distance from the metal plate and wherein the converging tip extends a distance greater than the distance that the projection on the plate extends.

37. The sealing element of claim 17 further comprising a metal plate wherein the metal plate includes the conductive material, and further comprising at least one wall defining an opening about a first axis through the sealing element for accepting a work piece, and at least one wall on the metal plate defining a contact surface for contacting a work piece when the work piece is inserted into the opening in the sealing element.

38. The sealing element of claim 37 wherein the metal plate wall is at least a partial cylinder having a second axis parallel to the first axis of the opening through the sealing element.

39. The sealing element of claim 38 wherein the at least partial cylindrical wall curves inwardly and then outwardly relative to the second axis.

40. The sealing element of claim 37 wherein the metal plate has at least one cut with sides along the cut to allow the sides of the cut in the metal plate to be spread.

41. The sealing element of claim 37 wherein the sealing element includes a first side and a second side wherein the opening has a first inside diameter and the opening extends from the first side to the second side and wherein the first side includes a wall defining rim at one end of the opening and wherein the second side includes a wall defining a second a rim at the end of the opening and wherein the first and second rims have diameters less than the first inside diameter of the opening for forming a seal about a work piece inserted into the opening.

42. A sealing element for sealing an opening in a panel, the sealing element comprising:

a cover portion for extending over a panel, the cover portion including an outer surface, and an inner surface for contacting a portion of a panel and a wall defining a first part of an opening through the sealing element and a first sealing surface at one end of the opening for sealing an element passing through the opening;

a holding portion for holding the sealing element within an opening in a panel and for holding the cover portion against a panel and having a wall defining a second part of an opening through the sealing element and a second sealing surface at one end of the opening for sealing an element passing through the opening;

a conductive plate adjacent the inner surface of the cover portion and having a first part extending through a portion of the cover portion and at least partly exposed for contacting a portion of a panel, and a second part extending in the opening and a pair of walls defining a slit for allowing insertion of an element into the opening through the sealing element;

and a fireproof fabric in the cover portion.

43. A sealing element for sealing an opening in a panel, the sealing element comprising:

a flanged portion for extending over a panel, the flanged portion including an outer surface, and an inner surface for contacting a portion of a panel;

a holding portion for holding the sealing element within an opening in a panel and for holding the flanged portion against a panel;

a conductive surface adjacent the inner surface of the flanged portion and at least partly exposed for contacting a portion of a panel; and a pass through portion between the holding portion and the flanged portion for contacting a wall of an opening in a panel into which the sealing element is to be inserted and having a surface for engaging the wall in the opening and wherein the surface of the pass through portion is entirely electrically non-conductive wherein no electrically conductive element extends between the pass through portion and the wall of the opening.

44. The sealing element of claim 43 further comprising an electrically conductive element including the conductive surface wherein the conductive element is suitable for blocking electromagnetic radiation.

* * * * *